(12) United States Patent
Baldwin et al.

(10) Patent No.: US 6,735,422 B1
(45) Date of Patent: May 11, 2004

(54) CALIBRATED DC COMPENSATION SYSTEM FOR A WIRELESS COMMUNICATION DEVICE CONFIGURED IN A ZERO INTERMEDIATE FREQUENCY ARCHITECTURE

(76) Inventors: Keith R. Baldwin, 1903 Redwood Ave., Melbourne Beach, FL (US) 32951; Patrick J. Landy, 3362 Lake View Cir., Melbourne, FL (US) 32934; Mark A. Webster, 250 Versailles Dr., Melbourne Beach, FL (US) 32951; R. Douglas Schultz, 4309 Ligustrum Dr., Melbourne, FL (US) 32934; John S. Prentice, 881 Vance Cir., N.E., Palm Bay, FL (US) 32905

(*) Notice: Subject to any disclaimer, the term of this patent is extended or adjusted under 35 U.S.C. 154(b) by 689 days.

(21) Appl. No.: 09/677,975
(22) Filed: Oct. 2, 2000
(51) Int. Cl.$^7$ .................................................. H04B 1/06
(52) U.S. Cl. .............................. 455/232.1; 455/234.1; 455/324; 455/303
(58) Field of Search .............................. 455/234.1, 324, 455/303, 341, 296, 305, 232.1, 67.11, 67.12, 67.13, 209

(56) References Cited

U.S. PATENT DOCUMENTS

| 3,953,805 | A | | 4/1976 | Couvillon |
| 4,823,129 | A | * | 4/1989 | Nelson ........................ 341/139 |
| 5,212,827 | A | | 5/1993 | Meszko et al. |

(List continued on next page.)

FOREIGN PATENT DOCUMENTS

| EP | 0 719 013 A2 | 6/1996 |
| EP | 0 729 230 A1 | 8/1996 |
| EP | 0 767 544 A2 | 4/1997 |
| EP | 0 948 128 A1 | 10/1999 |
| EP | 0 964 557 A1 | 12/1999 |

(List continued on next page.)

OTHER PUBLICATIONS

PCT Notification of Transmittal of International Preliminary Examination Report dated May 5, 2003, 6 pages.
Notice of References cited (from related application).
H. Tsurumi et al., "System–Level Compensation Approach to Overcome Signal Saturation, DC Offset, and $2^{nd}$ –Order Nonlinear Distortion in Linear Direct Conversion Receiver," *IEICE Transactions on Electronics*, Institute of Electronics Information and Comm. Eng. Tokyo, JP, vol. E82–C, No. 5, May 1999.

(List continued on next page.)

*Primary Examiner*—Edward F. Urban
*Assistant Examiner*—Lana Le
(74) *Attorney, Agent, or Firm*—Gary R Stanford

(57) ABSTRACT

A calibrated DC compensation system for a wireless communication device configured in a zero intermediate frequency (ZIF) architecture. The device includes a ZIF transceiver and a baseband processor, which further includes a calibrator that periodically performs a calibration procedure. The baseband processor includes gain control logic, DC control logic, a gain converter and the calibrator. The gain converter converts gain between the gain control logic and the DC control logic. The calibrator programs the gain converter with values determined during the calibration procedure. The gain converter may be a lookup table that stores gain conversion values based on measured gain of a baseband gain amplifier of the ZIF transceiver. The gain control logic may further include a gain adjust limiter that limits change of a gain adjust signal during operation based on a maximum limit or on one or more gain change limits. A second lookup table stores a plurality of DC adjust values, which are added during operation to further reduce DC offset. The calibration procedure includes sampling an output signal for each gain step of the baseband amplifier at two predetermined range values and corresponding DC offsets using successive approximation. The data is used to calculate gain, DC offset and DC differential values, which are used to determine the conversion values programmed into the lookup tables or the gain adjust limiter.

30 Claims, 10 Drawing Sheets

U.S. PATENT DOCUMENTS

| | | | | |
|---|---|---|---|---|
| 5,241,702 A | * | 8/1993 | Dent | 455/296 |
| 5,400,366 A | | 3/1995 | Iwamatsu | |
| 5,644,308 A | * | 7/1997 | Kerth et al. | 341/120 |
| 5,661,761 A | | 8/1997 | Iwamatsu | |
| 5,715,281 A | * | 2/1998 | Bly et al. | 455/209 |
| 5,872,810 A | | 2/1999 | Philips | |
| 5,901,347 A | | 5/1999 | Chambers et al. | |
| 6,009,126 A | * | 12/1999 | Van Bezooijen | 455/303 |
| 6,111,529 A | * | 8/2000 | Maulik et al. | 341/120 |
| 6,324,389 B1 | | 11/2001 | Väisäanen | |
| 6,327,313 B1 | | 12/2001 | Traylor et al. | |
| 6,473,471 B2 | | 10/2002 | Lindquist et al. | |

FOREIGN PATENT DOCUMENTS

| | | |
|---|---|---|
| EP | 1 172 928 A2 | 1/2002 |
| WO | WO 95/30275 A | 11/1995 |
| WO | WO 97/06604 A | 2/1997 |
| WO | WO 98/38799 A | 9/1998 |

OTHER PUBLICATIONS

PCT Notification of Transmittal of the International Search Report or the Declaration, dated Oct. 2, 2002, 8 pages.

A. Abidi, "Direct–Conversion Radio Transceivers for Digital Communications", *IEEE Journal of Solid–State Circuits, vol. 30, No. 12*, Dec. 1995, pp. 1399–1410.

B. Razavi, "Design Considerations for Direct–Conversion Receivers", *IEEE Transactions on Circuits and Systems—II: Analog and Digital Signal Processing*, vol. 44, No. 6, Jun. 1997, pp. 428–435.

J. Cavers et al., "Adaptive Compensation for Imbalance and Offset Losses in Direct Conversion Transceivers", *IEEE Transactions on Vehicular Technology, vol. 42, No. 4*, Nov. 1993, pp. 581–588.

A. Bateman et al., "Direct Conversion Transceiver Design for Compact Low–Cost Portable Mobile Radio Terminals", *IEEE Veh. Tech. Conf.*, 1989, pp. 57–62.

S. Sampei et al., "Adaptive DC–Offset Compensation Algorithm for Burst Mode Operated Direct Conversion Receivers", IEEE Veh. Tech. Conf., 1992, pp. 93–96.

PCT Notification of Transmittal of the International Search Report or the Declaration dated Apr. 2, 2003, 5 pages.

PCT Notification of Transmittal of the International Search Report or the Declaration dated Apr. 2, 2002, 7 pages.

* cited by examiner

CALIBRATED DC COMPENSATION SYSTEM FOR A WIRELESS COMMUNICATION DEVICE CONFIGURED IN A ZERO INTERMEDIATE FREQUENCY ARCHITECTURE

CROSS-REFERENCE TO RELATED APPLICATION(S)

The present application is related to U.S. Patent Application entitled "A DC Compensation System For A Wireless Communication Device Configured In A Zero Intermediate Frequency Architecture", Ser. No. 09/678,901, filed concurrently herewith.

FIELD OF THE INVENTION

The present invention relates to wireless communications, and more particularly to a calibrated DC compensation system for a wireless communication device configured in a zero intermediate frequency (ZIF) architecture that utilizes a DC control loop to enable direct conversion of radio frequency signals to baseband frequency and a calibration procedure that more accurately determines and controls DC voltage levels.

DESCRIPTION OF RELATED ART

Network communication is a growing area of technology both for business and home applications. A network system enhances communication and provides a suitable environment for enhanced productivity and capabilities both at home and in the workplace. The Internet for example, is a global, mostly wired, communication network that couples devices together on a world-wide basis that enables worldwide communication between any devices coupled to the Internet. The Internet enables access to a plurality of services, such as file sharing, faxing, chat, email and information access via websites to files, libraries, databases, computer programs, etc.

Many businesses and commercial entities include a relatively established and sophisticated network environment for enhanced productivity and communication. For example, Extranets or Intranets provide enhanced yet protected or secure communication to a selected group of people on the Internet. Many small businesses and homes are coupled to the Internet via some variation of local area network (LAN) or the like. It is becoming more advantageous and common for small businesses and home environments to include LAN capabilities to connect to the Internet or to access other services, such as file sharing, printing, faxing, etc. and to further enable communication such as via chat and email services, and the like and to provide access to common databases and libraries, etc. Many such small networks are connected through a set of wires. For example, a network may be established in a small office or home through standard phone wires. Phone wires are already available in each office of a business and in several rooms of a typical home. Technology also exists to establish network communications via power lines which are typically available in every room of a house. Many small offices and homes may alternatively be wired with network wires, such as a twisted-pair telephone wires with corresponding RJ-45 connectors utilized by various Ethernet embodiments.

Wired networks provide a certain level of convenience but have many limitations. Each device coupled to the network must be attached to a corresponding wire through which the network is established. The location of each device, therefore, is limited to enable access to the network wires. Cable management is also a significant issue, since devices must be placed to enable proper routing of wires. It is desired that the wires be conveniently placed and for aesthetic reasons, out of sight. Wires should be located in such a manner as to reduce or eliminate any chance of accidental interference or disconnect or hazards such as tripping. Once wired devices are properly placed, movement of the devices is very limited or otherwise not practical without substantial re-configuration or re-routing of the wires. Maintenance of wired network devices can be inconvenient and often requires that the wires be removed during service and then reconnected properly.

Certain wireless technologies are known, such as infrared technology. Infrared technology works well for certain applications, such as remote control systems or the like. For network applications, infrared technology is a relatively inexpensive option but has certain limitations, including limited bandwidth, range limitations, and line-of-sight issues. Infrared technology has been utilized in certain applications, such as access points (APs) and point to point relay nodes to extend a network down hallways and the like. For example, infrared devices are known for use in hospitals, hotels and other relatively large structures. The APs or nodes, however, are usually fixed and located in such a manner, such as on the ceiling, to avoid potential interference with physical objects. Due to line of sight issues, infrared technology is not particularly convenient for network communications at the end points of the network where human interaction is necessary.

Radio frequency (RF) technology appears to be the technology of choice for establishing a viable wireless local area network (WLAN). RF technology for LAN systems, however, is not particularly optimized for small office or home use. Wireless technology is established for industrial and commercial uses and applications such as courier services, vehicle rentals, warehouse operations and inventories, etc. The wireless embodiments for commercial and industrial applications are too expensive or otherwise specialized and thus are not suited for direct use in the small office or home environment.

The Bluetooth technology is being developed for application in the home or office. Bluetooth technology offers relatively limited bandwidth at very low cost to enable connectivity and network communications between certain communication devices, such as cellular phones, computer systems including notebook, laptop and desktop computers and further including other hand-held devices such as personal digital assistants (PDAs) or the like. The Bluetooth technology, however, has limited bandwidth and therefore relatively low data throughput capability. The consumer market demands higher data throughput and reliability such as is necessary for DVD and other multimedia applications.

The typical environment for a WLAN is very noisy and not optimal for wireless communications. For example, most homes include many electronic devices resulting in an electronically noisy environment that may interfere with WLAN communications, such as microwave ovens, garage door openers, radios, television sets, computer systems, etc. Further, the communication medium between wireless devices constantly changes. For example, most environments or rooms include multiple reflective surfaces creating multipath noise in the wireless environment. Furthermore, movement of items or devices or the like such as hands, bodies, jewelry, mouse pointers, etc. or activation of electronic devices, such as cooling fans or the like, affects the overall wireless communication path and potentially degrades wireless communication performance.

Low cost and low power wireless communication devices for enabling a WLAN system or the like for use at home or in the small business is desirable. It is further desired to provide low cost and low power wireless communication devices for any type of wireless system for any type of application. The system must be relatively robust with significant performance and be capable of significant data throughput.

SUMMARY OF THE INVENTION

A calibrated DC compensation system for a wireless communication device configured in a zero intermediate frequency (ZIF) architecture that includes a gain converter and a calibrator that periodically performs a calibration procedure and that programs the gain converter accordingly. The wireless device includes a combiner that combines a DC offset signal from an input signal and that provides an adjusted input signal. The wireless device further includes DC control logic that generates the DC offset signal and gain control logic that attempts to keep the input signal power at a target level. The gain converter converts gain between the gain control logic and the DC control logic based on programmed values.

In a primary signal path of the wireless device, the gain amplifier receives the adjusted input signal and provides an amplified input signal based on a gain adjust signal. The gain control logic includes a gain feedback circuit that receives the amplified input signal, that estimates input signal power and that provides the gain adjust signal in an attempt to maintain the input signal power at the target power level. The DC control logic includes a DC estimator that estimates a DC level in the amplified input signal and that provides a DC estimate signal. The DC control logic also includes a DC amplifier that receives the DC estimate signal and that provides the DC offset signal based on a gain conversion signal. The gain converter receives the gain adjust signal and provides the gain conversion signal to the DC amplifier.

The gain converter may be a lookup table that stores gain conversion values. During operation, the lookup table provides a gain conversion value for each gain step of the gain adjust signal. The calibrator performs the calibration procedure to determine gain values, where each gain value represents the gain of the gain amplifier at each gain step of the gain adjust signal. The calibrator determines the gain conversion values based on the gain values and programs the lookup table. The calibrator may incorporate differences in gain ranges and gain scales between the gain amplifier and the DC amplifier when determining the gain conversion values.

During each calibration procedure, the calibrator controls the gain feedback circuit to apply the gain adjust signal to each gain step, adjusts a DC offset and samples the amplified input signal until the amplified input signal achieves first and second predetermined range values. The calibrator determines first and second DC offset values that correspond to the first and second predetermined range values, respectively. The calibrator determines the gain conversion values using the range values and the DC offset values for each of the gain steps. The first and second predetermined range values may correspond to a predetermined range of the amplified input signal, where the calibrator uses a successive approximation procedure to determine the first and second DC offset values. For example, the predetermined range values may correspond to ±75 millivolts (mV) full scale values.

The gain feedback circuit may further include a gain adjust limiter that limits change of the gain adjust signal during operation. The gain adjust limiter may limit the change of the gain adjust signal based on a maximum gain change limit or on one or more gain change limits. A separate gain change limit may be provided for each gain step of the gain adjust signal, or those gain steps that correspond to higher gain levels. The calibrator may use an upper bound method to determine the maximum gain change limit based on the determined gain values and a predetermined linear DC offset change model of the gain amplifier. The calibrator determines a plurality of DC offset values, where each DC offset value corresponds to one of the gain values determined for the gain amplifier. The calibrator determines the gain change limits using the gain values and DC offset values and programs the gain adjust limiter with the resulting gain change limits. During operation, the gain adjust limiter monitors the current level of the gain adjust signal, receives an error signal indicated desired change of the gain adjust signal, retrieves a corresponding gain change limit and limits application of the error signal to change the gain adjust signal based on the retrieved gain change limit.

Alternatively or in addition, the calibrated DC compensation system includes a second lookup table that stores a plurality of DC adjust values, each corresponding to one of the gain steps of the gain adjust signal. In operation, the second lookup table provides a corresponding DC adjust value for each gain step of the gain adjust signal. The calibrator determines the DC adjust values using the first and second DC offset values for each of the gain steps of the gain adjust signal. The DC amplifier provides a gain compensated DC signal to a combiner, which adds a DC adjust value from the second lookup table to the gain compensated DC signal to provide the DC offset signal.

Alternatively, the gain converter may include an adjust memory which includes a plurality of adjust values, each adjust value corresponding to a gain step of the gain adjust signal. The gain converter provides the gain conversion signal to the DC amplifier based on the gain adjust signal and a corresponding adjust value. The calibrator determines a plurality of DC differential values, each DC differential value corresponding to at least one gain step of the gain adjust signal. The calibrator programs the adjust memory based on the DC differential values. The adjust values may incorporate conversion of gain ranges and gain scales between the gain amplifier and the DC amplifier, and may comprise multipliers or additive values.

In a more specific embodiment, the wireless communication device includes a ZIF transceiver and a baseband processor, where the baseband processor includes calibration logic that periodically performs a calibration procedure. The ZIF transceiver includes a radio frequency (RF) mixer circuit that converts an RF signal to a baseband input signal, a combiner that combines a DC offset with the baseband input signal to provide an adjusted baseband input signal, and a baseband amplifier that receives the adjusted baseband input signal and that asserts an amplified input signal based on a gain adjust signal. The baseband processor includes gain control logic, DC control logic, a gain converter and the calibration logic. The gain control logic receives the amplified input signal, estimates input signal power and asserts the gain adjust signal in an attempt to keep the input signal power at a target power level. The DC control logic estimates an amount of DC in the amplified input signal and provides the DC offset in an attempt to reduce DC in the amplified input signal. The gain converter converts gain between the gain control logic and the DC control logic. The calibration logic programs the gain converter with values determined during the calibration procedure.

A method of reducing DC in a wireless ZIF device includes converting a received radio frequency (RF) signal to a baseband signal, combining a DC offset with the baseband signal to achieve an adjusted baseband signal, amplifying the adjusted baseband signal based on a gain signal to achieve an amplified input signal, determining a power level of an input baseband signal from the amplified input signal, controlling the gain signal to achieve a target power level of the input baseband signal, determining a DC level of the amplified input signal, providing a gain conversion signal based on the gain signal, controlling the DC offset based on the gain conversion signal and the determined DC level of the amplified input signal in an attempt to reduce the DC level of the amplified input signal, and periodically performing a calibration procedure to adjust the gain conversion signal.

The calibration procedure may further comprise measuring a gain value for each of a plurality of gain levels of the gain signal, and storing a plurality of gain conversion values. The method may include providing one of the plurality of gain conversion values for each of the plurality of gain levels of the gain signal. The calibration procedure may further include determining a maximum gain change limit, where the method includes limiting change of the gain signal based on a gain level of the gain signal and the maximum gain change limit. The calibration procedure may further include measuring a plurality of DC offset values, each corresponding to one of a plurality of gain levels of the gain signal, determining a plurality of gain change limit values based on the gain values and the DC offset values, and storing the gain change limit values. The method may further include limiting change of the gain signal based on a gain level of the gain signal and a corresponding gain change limit values. The method may further include storing a plurality of DC adjust values and adding a DC adjust value based on a gain level of the gain signal.

The method may further include setting the gain signal to each of a plurality of gain levels, and for each gain level, determining a first DC offset value to achieve a first predetermined range limit of the amplified input signal, and determining a second DC offset value to achieve a second predetermined range limit of the amplified input signal. The determining of the first and second DC offset values may be based on successive approximation.

It is appreciated that removal of the IF portion of a high performance wireless transceiver, with proper DC compensation and DC calibration, results in a relatively high performance, low cost wireless ZIF transceiver with reduced power requirements. The use of a calibrated DC compensation loop interfaced to the gain loop according to embodiments of the present invention achieves these goals. Such capability enables a WLAN system to be designed for use at home or in the small business that is relatively robust and that has significant performance with relatively high data throughput operation.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF EMBODIMENT(S) OF THE INVENTION

Figure 1:
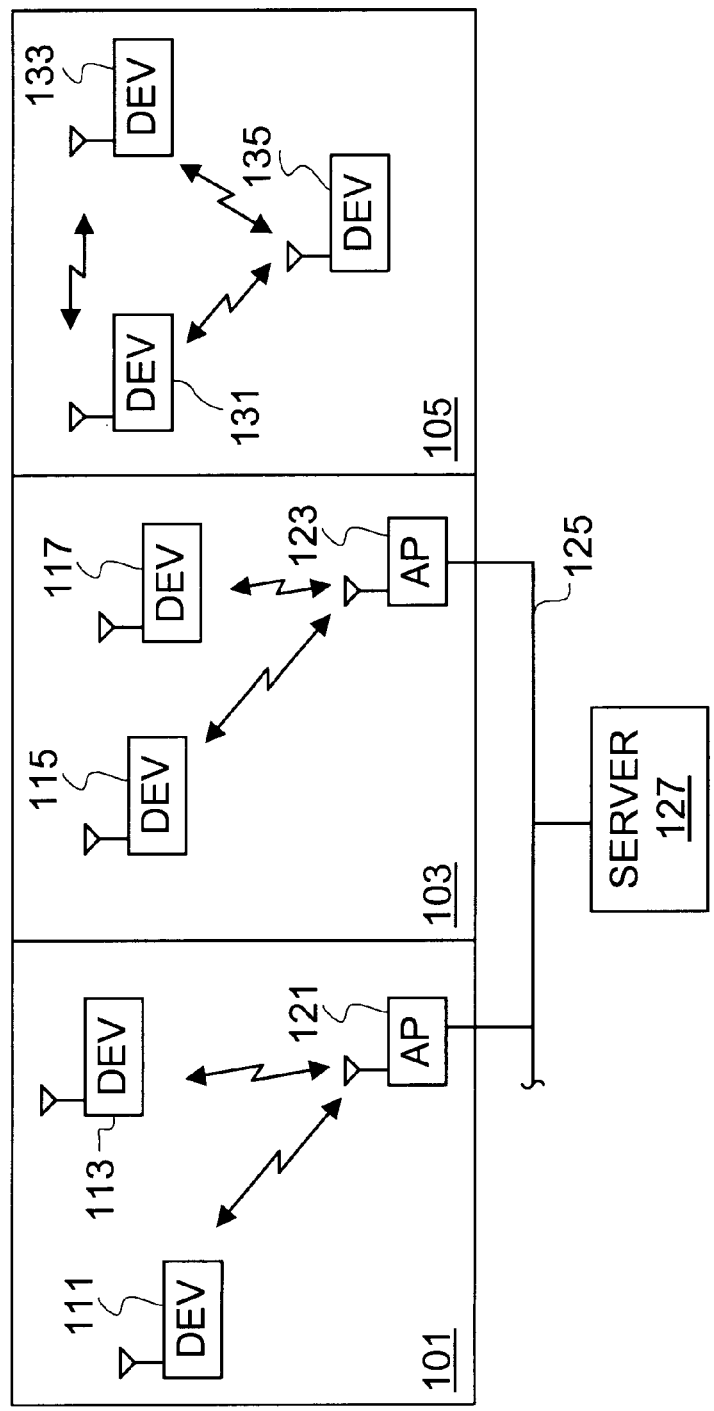
FIG. 1 is a block diagram of one or more wireless LANs generally illustrating operation of wireless devices implemented according to one or more embodiments of the present invention.

FIG. 1 is a block diagram of one or more WLANs generally illustrating operation of wireless devices implemented according to one or more embodiments of the present invention. Although the present invention is illustrated for use with WLANs in exemplary embodiments, it is understood that the present invention applies for any radio or wireless communications and is not limited to WLAN applications. A first area 101 and a second area 103 represent separate compartments or divisions of a location such as offices within an office building or rooms within a house. The areas 101 and 103 may each include wireless access points (APs) 121 and 123 for controlling communications within the respective areas 101 and 103. As shown, the APs 121, 123 are coupled to a wired network such as a LAN 125, which is further coupled to a common server computer 127.

Within the area 101, wireless devices 111 and 113 are able to communicate with each other via the AP 121, and within the area 103, wireless devices 115 and 117 are able to communicate with each other via the AP 123. The AP 121 enables the devices 111 and 113 to communicate to the server 127 via the LAN 125 and the AP 123 also enables the devices 115 and 117 to communicate to the server 127 via the LAN 125. It is further noted that the LAN 125 enables the devices 111, 113, 115 and 117 to communicate with each other and with any other device coupled thereto.

APs, if used, are usually connected to a wired LAN, such as the LAN 125, although they need not be. The number and location of APs usually depends on the particular configuration and needs, such as the number of users served, range of coverage, and/or adjacent channel interference. It is noted that a single AP can serve a whole floor of rooms subject to user density and interference. Multiple APs are used much like cells in cellular communication. Adjacent APs may operate on adjacent channels to prevent interference. Roaming capability may be enabled to allow devices to move from one area to another, such as from area 101 to 103 and vice versa. Generally, each AP has additional software and has access to house or building main power.

An alternative embodiment is shown by area 105 including devices 131, 133 and 135. The devices 131, 133 and 135 communicate directly with one another rather than via any APs. Networks without APs are ad hoc in nature and typically contain fewer clients. The primary difference between the devices 111, 113, 115 and 117 from the devices 131, 133 and 135 is the mode of operation. Each of the wireless devices 111, 113, 115, 117 and 131, 133, 135 includes a wireless transceiver that may be implemented according to an embodiment of the present invention for enabling wireless communications.

The devices 111, 113, 115, 117, 131, 133, and 135 may be any type of device that includes wireless communication capabilities. In an office or home environment for example, the devices may each comprise any one or more personal computers, laptop computers, desktop computers, etc., printing devices including any type of printer technology, personal digital assistants (PDAs) or the like, scanners, fax machines, etc. The use of wireless technology enables any of the devices to be located anywhere within a given area to communicate with, and transfer data and information between, other devices within the same communication area. For example, the device 111 may be a computer that wirelessly communicates to the device 113 which may be a printer. Further, the device 111, as a computer, may send and receive files to the server 127. The device 111 may be moved to the area 103 from area 101 and still maintain communication with the LAN 125 and the server 127 via the AP 121. The LAN 125 may comprise any type of wire technology, such as telephone wires, power wires, twisted-pair, coaxial cables, etc., and may be implemented according to any type of suitable architecture, such as any type of Ethernet configuration or the like. It is further noted that a wireless LAN 125 is contemplated, where the APs 121, 123 is include corresponding wireless transceivers and are mobile or portable devices. Within the area 105, the devices 131–135 themselves establish a wireless LAN (WLAN) for communicating to each other in a similar fashion.

Figure 2:
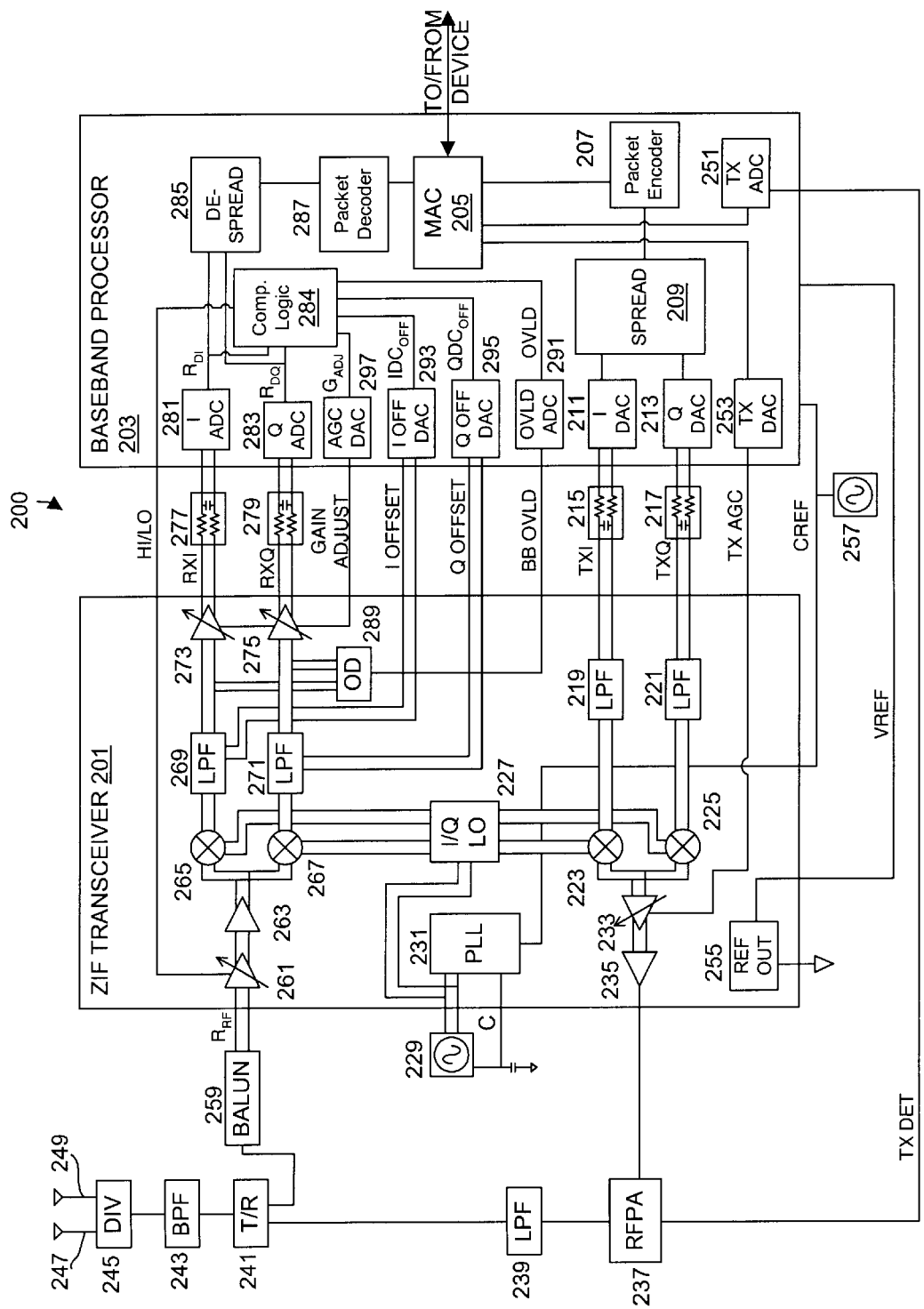
FIG. 2 is a simplified schematic and block diagram of a wireless transceiver in a Zero Intermediate Frequency (ZIF) architecture and implemented according to an embodiment of the present invention that may be incorporated within any of the devices or access points of FIG. 1.

FIG. 2 is a simplified schematic and block diagram of a wireless transceiver 200 implemented according to an embodiment of the present invention that may be incorporated within any of the devices 111, 113, 115, 117, 131–135 and in either or both of the APs 121, 123. It is understood, however, that the wireless transceiver 200 is not limited to WLAN configurations, which are exemplary only, but instead may be employed in other types of radio or wireless communications for other types of applications. The wireless transceiver 200 is implemented as a zero intermediate frequency (ZIF) architecture including a ZIF transceiver 201 and a baseband processor 203. As described more fully below, the ZIF architecture enables a simplified configuration by entirely eliminating intermediate frequency (IF) logic and associated circuitry. In this manner, only two primary modules, chips, or ICs (transceiver and processor) are utilized in the ZIF architecture to enable wireless communications. This, in turn, significantly reduces the number of components, reduces cost and further reduces power consumption of the wireless transceiver 200 as compared to similar transceivers including IF circuitry and logic.

A problematic characteristic of traditional ZIF architectures is the introduction of substantial DC offset voltages in the receiver that must be compensated for or otherwise eliminated to capture incoming signals and allow communications. The wireless transceiver 200 is configured with an automatic gain control (AGC) loop 345 (FIG. 3) combined with a DC loop 347 to measure and reduce or otherwise eliminate undesired DC in the receiver. As described further below, the AGC loop 345 includes gain control logic that receives an amplified input signal, that estimates input signal power and that asserts a gain adjust signal in an attempt to keep the input signal power at a target power level. The DC loop 347 includes DC control logic that estimates an amount of DC in the amplified input signal and that provides a DC offset in an attempt to reduce DC in the amplified input signal. Also, a gain interface is provided that converts gain levels between the gain control logic and the DC control logic.

The wireless transceiver 200 may utilize any desired carrier frequency and modulation technique to achieve any of several corresponding data throughputs. For example, the wireless transceiver 200 may be configured to operate according to the Institute of Electrical and Electronics Engineers (IEEE) 802.11b with a carrier frequency of approximately 2.4 gigahertz (GHz) and with data throughputs of 1, 2, 5.5 or 11 Megabits per second (Mbps). Alternatively, the wireless transceiver 200 may be configured according to IEEE 802.11a with a carrier frequency of approximately 5 GHz for data throughputs of 6, 12, 18, 24, 36 or 54 Mbps. In the embodiment shown, the wireless transceiver 200 operates in accordance with IEEE 802.11b at a carrier frequency of 2.4 GHz with data throughput rates of 1, 2, 5.5 or 11 Mbps. The direct sequence spread spectrum (DSSS) modulation technique is used in the embodiment shown, although it is understood that the present invention is not limited to any particular communication or modulation technique or standard.

Any of the devices 111–117 or 131–133 or the APs 121, 123 may be configured according to the wireless transceiver 200. The particular configuration depends upon the type of device and communication interface. The wireless transceiver 200 may be configured as a plug-in peripheral or expansion card that plugs into an appropriate slot or interface of a computer system. For example, for portables and laptop computers and the like, the wireless transceiver 200 may be implemented as a Personal Computer Memory Card International Association (PCMCIA) card or PC Card that plugs into a PC Card slot of the computer. The antenna may be incorporated on the PC Card itself, or provided externally or on the computer and interfaced to the PC Card in any appropriate manner. For desktop computers and the like, the wireless transceiver 200 may be implemented according to any type of expansion or peripheral standard, such as according to the peripheral component interconnect (PCI), the Industry Standard Architecture (ISA), the Extended-ISA (EISA) standard, etc. For example, the wireless transceiver 200 may be implemented on a PCI card that plugs into a PCI slot. Again, the antenna may be integrated or coupled externally. Mini PCI cards with antennas embedded in displays are also contemplated. Self-contained or standalone packaging with appropriate communication interface(s) is also contemplated, which is particularly advantageous for APs. For example, the wireless transceiver 200 may be implemented as a separate unit with serial or parallel connections, such as a Universal Serial Bus (USB) connection or an Ethernet interface (twisted-pair, coaxial cable, etc.), or any other suitable interface to the device.

Digital data sent from or received by the wireless transceiver 200 is processed through a medium access control (MAC) device 205. For transmission, the MAC device 205 asserts digital data signals to a packet encoder 207, which formulates the data into packets for transmission. In packet encoder 207, a packet is formed by the concatenation of three serial bit streams. The first serial bit stream, referred to as the preamble, is a 1 Mbps stream of ones or zeroes followed by a synchronization (sync) pattern. The second serial bit stream, referred to as the header, is a 1 or 2 Mbps stream of packet information, such as packet length and the data rate of the data portion of the packet. The third serial bit stream, referred to as the data portion or payload, is any selected one of 1, 2, 5.5, or 11 Mbps streams of data.

The packet encoder 207 provides baseband encoded packets to a spreading encoder (SPREAD) 209. In the embodiment shown, the 1 and 2 Mbps bit rates are encoded according to Barker word encoding spreading, whereas the 5.5 and 11 Mbps bit rates are encoded according to Complementary Code Keying (CCK) encoding. The spreading encoder 209 uses a quadrature generation technique and provides in phase (I) and quadrature (Q) signals on respective I and Q channels. For 1 Mbps, every bit in 11 chips of a Barker word are output identically on the I and Q channels. If the input bit is zero, then the sense of the 11 chips is inverted, and if the input bit is one, the sense of the 11 chips is not inverted. The data is thus spread by the Barker code. For 2 Mbps, for every two bits input, 11 chips are output on each of the I and Q channels. One bit is used to invert or not the I channel and the other bit is used for the Q channel. For 5.5 Mbps, 4 bits are mapped to 8 complex (I and Q channel) chips. 8 chip complex code words are chosen and then rotated according to specific rules defined in the standard. 11 Mbps is similar to 5.5 Mbps, except that 8 bits are mapped to 8 complex chips.

The I channel signal is provided to an I digital-to-analog converter (I DAC) 211 and the Q channel signal is provided to a Q DAC 213, where the I DAC 211 and the Q DAC 213 also receive a clock signal CREF from a clock source 257. In one embodiment, the CREF signal is 44 MHz based on the 22 MHz fundamental for IEEE 802.11b. The I DAC 211 and the Q DAC 213 up-sample and digitally filter the I and Q channel signals, respectively. For 11 Mbps, the I and Q DACs convert each chip to four samples. The I DAC 211 asserts an I channel analog output signal to an anti-aliasing low-pass filter (AA LPF) 215, which provides an I channel transmit signal TXI to an LPF 219 within the ZIF transceiver 201. The Q DAC 213 asserts a Q channel analog output signal to another AA LPF 217, which provides a Q channel transmit signal TXQ to the input of another LPF 221 within the ZIF transceiver 201.

An external voltage controlled oscillator (VCO) 229 provides an output local oscillator (LO) signal at approximately 4.8 GHz to a phase lock loop (PLL) 231 and an input of an I/Q LO generator 227. In one embodiment, a reference crystal is used to tune the VCO 229 by a voltage control to generate the 4.8 GHz LO signal. The PLL 231 receives the CREF clock signal which is divided down to an appropriate low frequency signal. The PLL 231 also divides down the VCO 4.8 GHz signal to the same appropriate low frequency signal. A phase detector circuit (not shown) within the PLL 231 compares these two low frequency signals—one being the CREF signal and the other from the VCO 229, and generates a correction (C) signal which after filtering is input to the VCO 229. This phase locked loop system reduces jitter on the VCO output LO signal. The I/Q LO 227 divides the 4.8 GHz carrier signal from the PLL 231 by two and generates two separate 2.4 GHz carrier signals, including an in-phase (I) carrier signal, and a quadrature (Q) carrier signal. The I and Q carrier signals are 90 degrees out of phase with respect to each other. The I carrier signal is provided to one input of an I channel mixer 223, and the Q carrier signal is provided to one input of a Q channel mixer 225. The other input of the I channel mixer 223 receives the output of the LPF 219 and the other input of the Q channel mixer 225 receives the output of the LPF 221. The I channel mixer 223 combines the I carrier signal with the I channel transmit signal to up-convert the I channel from baseband to 2.4 GHz radio frequency (RF). The Q channel mixer 225 combines the Q carrier signal with the Q channel transmit signal to up-convert the Q channel from baseband to 2.4 GHz RF. The outputs of the I/Q channel mixers 223, 225 are combined at the input of a variable gain amplifier (VGA) 233. The VGA 233 asserts an amplified transmit signal to the input of a fixed-gain amplifier 235, which provides its output to a radio frequency power amplifier (RFPA) 237. The RFPA 237 asserts an amplified RF signal to an RF LPF 239, which provides a filtered RF output signal to one input of a transmit/receive (T/R) switch 241. For transmission, the T/R switch 241 provides the RF output of the LPF 239 to a bidirectional band pass filter (BPF) 243, which provides a filtered RF output to a diversity switch 245. The diversity switch 245 asserts the RF transmit signal on a selected one of two antennas 247, 249.

The RFPA 237 asserts a transmit detect (TX DET) signal back to a transmit analog-to-digital converter (ADC) 251 within the baseband processor 203, which provides a corresponding digital feedback signal to the MAC 205. The MAC 205 includes a power control algorithm that detects the transmitted output signal via the ADC 251 and provides a feed forward signal to the input of a transmit (TX) DAC 253, which asserts a transmit automatic gain control (TX AGC) signal to control the gain of the VGA 233. Further, the ZIF transceiver 201 includes a voltage reference source 255 to provide a voltage reference (VREF) signal for the ZIF transceiver 201 and for the baseband processor 203. The VREF signal may be any convenient voltage, such as 1.2 volts or the like. The clock source 257 provides the CREF signal to the PLL 231 within the ZIF transceiver 201.

The T/R switch 241 is selected to receive signals from either of the antennas 247, 249 and provides a filtered signal (through BPF 243) to the input of a balanced/unbalanced (BALUN) impedance matching network 259. The BALUN 259 provides a received RF input signal RRF to the input of a variable LNA 261. The LNA 261 asserts its output to the input of a fixed-gain LNA 263. The LNA 263 asserts the amplified RF receive signal to respective inputs of an I channel mixer 265 and a Q channel mixer 267. The I/Q LO 227 asserts the I carrier signal to another input of the I channel mixer 265 and the Q carrier signal to another input of the Q channel mixer 267. The I channel mixer 265 splits the I carrier frequency from the I channel output signal in the RF receive signal and provides the I channel output signal to an LPF 269. In a similar manner, the Q channel mixer 267 splits the Q carrier frequency from the Q channel output signal in the RF receive signal and provides the Q channel output signal to an LPF 271.

The output of the LPF 269 is provided to the input of a variable baseband automatic gain control (BB AGC) amplifier 273. In a similar manner, the LPF 271 asserts its output to the input of another BB AGC amplifier 275. The BB AGC amplifier 273 asserts an amplified I channel analog receive signal (RXD to the input of an I channel receiver AA LPF 277, which asserts its output to the input of an I channel ADC (I ADC) 281 within the baseband processor 203. The BB AGC amplifier 275 asserts an amplified Q channel analog receive signal (RXQ) to the input of a Q channel AA LPF 279, which provides its output to an input of a Q channel ADC (Q ADC) 283 within the baseband processor 203. The I ADC 281 and the Q ADC 283 assert respective I and Q channel digital receive signals $R_{DI}$, $R_{DQ}$ to a spreading decoder (DE-SPREAD) 285, which performs the opposite process as the spreading encoder 209 to retrieve received baseband encoded packets. The spreading decoder 285 provides the received baseband packets to a packet decoder 287, which, among other functions, retrieves the packet payloads and generates a stream of received data signals. The $R_{DI}$ and $R_{DQ}$ signals are also provided to compensation logic 284, further described below. The data signals from the packet decoder 287 are provided to a receive input of the MAC device 205, which provides received signals to the corresponding device across the implemented interface. The MAC interface may be incorporated internally within a device, such as on a PC CARD or the like, or may be external with appropriate external connectors, such as according to USB or the like.

An overload detector (OD) 289 within the ZIF transceiver 201 has first and second inputs coupled to the respective outputs of the LPF 269 and LPF 271 to detect an overload in the received input signal. The overload detector 289 asserts a baseband overload (BB OVLD) signal to an OVLD ADC 291 within the baseband processor 203, which provides a corresponding digital overload signal OVLD to the compensation device 284. In this manner, the compensation device 284 detects an overload of the received signal and asserts a HI/LO signal to control the variable LNA 261 of the ZIF transceiver 201. In the embodiment shown, the variable LNA 261 has an approximate 33 decibel (dB) step differential between a high gain (HI) and a low gain (LO). The gain is initially set high to detect weak signals and is switched to low gain upon certain conditions if the receive signal causes an overload condition as detected by the overload detector 289.

As more fully described below, the compensation device 284 controls the gain of the received signal to a target power level by asserting a gain adjust signal $G_{ADJ}$ to a gain DAC referred to as the AGC DAC 297. The AGC DAC 297 asserts a corresponding analog feedback gain control signal GAIN ADJUST to control the gain of both of the BB AGC amplifiers 273, 275. A single gain control signal is provided to both of the BB AGC amplifiers 273, 275 so that the gain of the I and Q channels of the receive signal appropriately track one another. The compensation device 284 further asserts respective digital I and Q channel DC offset signals $IDC_{OFF}$, $QDC_{OFF}$ to an I channel offset (I OFF) DAC 293 and a Q channel offset (Q OFF) DAC 295, respectively. The I OFF DAC 293 asserts an I channel DC offset analog signal (I OFFSET) to the LPF 269 and the Q OFF DAC 295 asserts a Q channel DC offset analog signal (Q OFFSET) to the LPF 271. In this manner, the compensation device 284 attempts to measure and reduce or otherwise eliminate DC offsets in both the I and Q channels of the receive signal within the ZIF transceiver 201.

A ZIF architecture is utilized to obtain sufficient performance and higher data throughput at lower cost and power consumption. This is particularly advantageous to the consumer market which demands multimedia and DVD applications requiring relatively good performance. The consumer market also demands a lower cost. The ZIF architecture is one way to achieve lower cost with sufficient performance by eliminating IF components and external filters. The target carrier frequencies are in the GHz range such as 2–5 GHz ranges and higher, although the present invention is not limited to any particular frequency range. The 2–5 GHz bands are relatively noisy with significant amounts of interference. The ZIF architecture is utilized to maintain a level of performance in a noisy environment.

A particular problem with the ZIF architecture is the development of DC offsets at baseband that degrade signal-to-noise (SNR) ratio, which is directly related to performance of the system. The IF stage, which may be utilized to combat a significant level of DC offset, is not provided in the ZIF architecture. A number of sources of DC offset are due to temperature change, such as die self-heating of integrated circuits. The receive mixers 265, 267 internally inject DC offset from the carrier frequencies generated by the I/Q LO 227. This LO DC offset varies with RF frequency or channel selection as well as a selected level of gain of the variable LNA 261. This change occurs very quickly with changes of channel or gain. A slow DC drift with temperature also occurs. Externally, the LO carrier frequencies from the I/Q LO 227 leaks to the antenna input port causing DC offset. This external DC offset varies with changes in the external environment, such as movement of hands, bodies, jewelry, mouse pointers, activation of electronic devices such as cooling fans or the like and re-radiation from nearby reflectors around the antenna. Movement of the wireless devices or changes in antenna direction also causes significant changes of the propagation characteristics of the channel or area. Such environmental changes induce impedance changes that dynamically change LO leakage magnitude and phase.

The receive mixers 265, 267 also exhibit DC offsets at their outputs. This DC offset is primarily a function of circuit matching, such as bipolar and Metal Oxide Semiconductor (MOS) device matching and resistor matching. This DC offset also drifts due to temperature variations and self-heating. The I and Q channel LPFs 269, 271 also exhibit offset at their outputs. This DC offset is also primarily a function of circuit matching. The I and Q channel baseband AGC amplifiers 273, 275 also exhibit DC offset at their inputs. This DC offset is also primarily a function of circuit matching. Due to the analog control circuitry associated with this function, the impact of matching variation is more severe than the DC offset experienced by the receive mixers 265, 267 and the LPFs 269, 271. This DC offset also changes non-linearly with gain setting, and drifts due to temperature variation and self-heating. The control voltage versus gain characteristic may also vary slowly with time. The main reason for drift is slower package temperature variations. A certain level of DC offset due to internal radio jamming from harmonics of digitally generated signals also occurs. As radio jamming is injected into the antenna and/or RF front end, this DC offset is a function of channel and LNA gain as well as a strong function of the particular digital circuit that is creating the spurious signal. Below a certain frequency (f) such as 1 kilohertz (kHz), 1/f noise appears as an impairment similar in effect to DC offsets.

It is noted that one possible solution of removing DC offset is through AC coupling, such as using coupling capacitors or the like. However, AC coupling results in filtering that tends to filter out low frequency content. The amount of data thrown away becomes significant above 1 kHz, so that AC coupling must only filter below 1 kHz. Within this range, however, the settling time is too long, such as on the order of approximately 100 microseconds ($\mu s$), which is not practical in a bursty environment such as packet-based communications. The settling time is limited due to the bursty nature of communication. Short preamble time lines of EEE 802.11a and IEEE 802.11b standards have little room for accurate DC estimation.

All of the sources of DC offsets are referenced to the inputs of the BB AGC amplifiers 273, 275. The gain range of the BB AGC amplifiers 273, 275 must be sufficient to guarantee acceptable performance in a variety of environments. In the embodiment shown, the gain range of each of the BB AGC amplifiers 273, 275 is approximately −6 dB to 60 dB, or 0.5 V/V to 1000 V/V to obtain the desired operation range of approximately 0.7 V/V to 800 V/V. It has been determined that the DC offset range can be on the order of ±50–100 millivolts (mV). It is desired that the DC correction occur before the baseband amplifiers 273, 275 because of its significant gain range.

Figure 3:
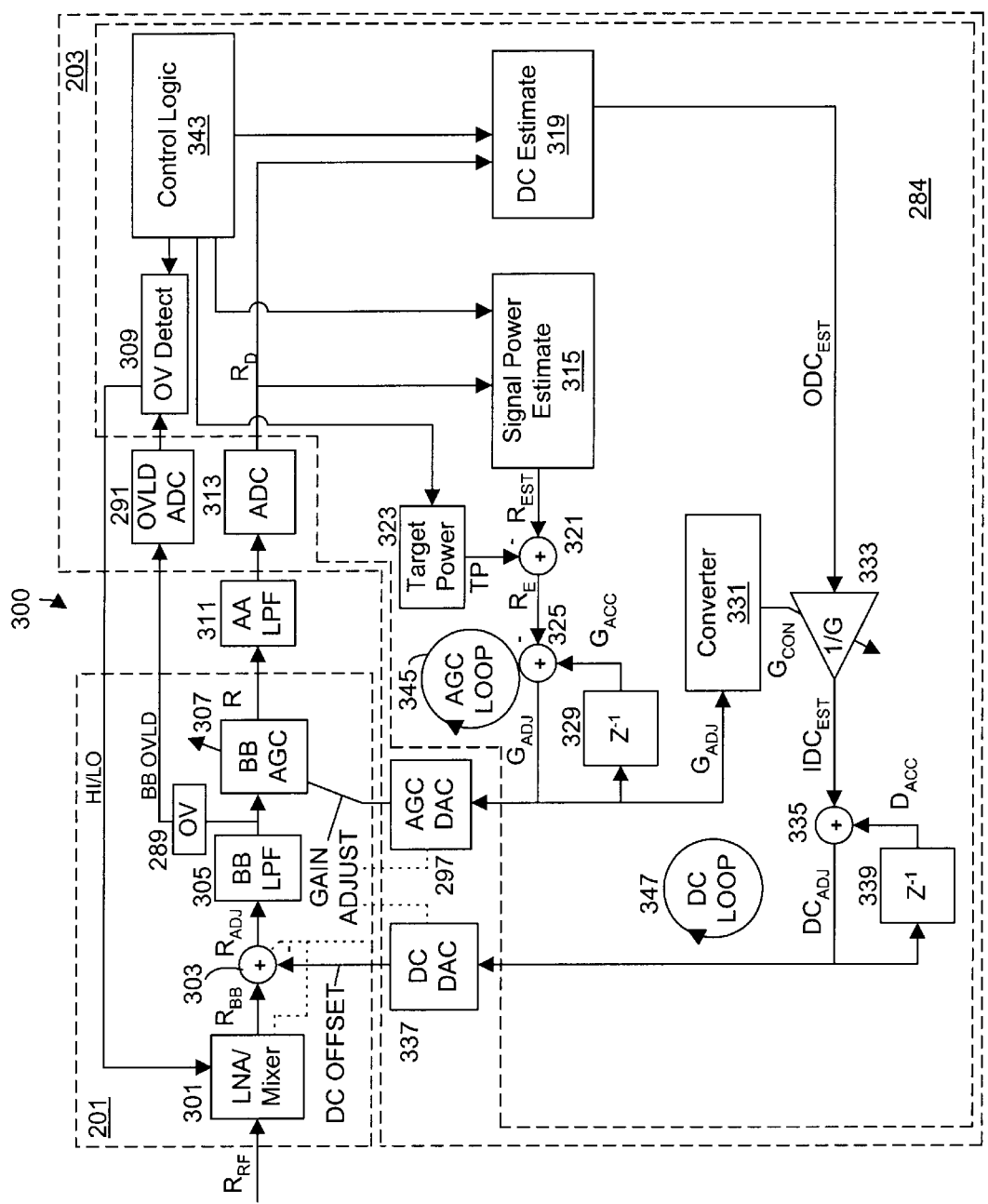
FIG. 3 is a block diagram of a compensation system utilized to control the gain of the received signal and to reduce or eliminate DC offsets in the wireless transceiver of FIG. 2.

FIG. 3 is a block diagram of a compensation system 300 utilized to control the gain of the received signal and to reduce or eliminate DC offsets in the ZIF architecture. The compensation system 300 illustrates operation of the receive portion of the wireless transceiver 200 for purposes of gain and DC compensation. The compensation system 300 includes various blocks representative of the elements within the wireless transceiver 200, including circuitry from the ZIF transceiver 201 and the baseband processor 203, with a focus on the operations of the compensation logic 284. The block diagram of the compensation system 300 is simplified in that the separate I and Q channel signals are illustrated by single communication path, which represents operation of both I and Q channels. Thus, it is noted that the same techniques are applied for both the I and Q channels and thus are applicable for use in the wireless transceiver 200.

The received RF input signal $R_{RF}$ from the antennas 247, 249 through the BALUN 259 is provided to an RF mixer circuit referred to as the LNA/mixer 301, which represents the LNAs 261, 263 and the receive mixers 265, 267. The LNA/mixer 301 provides a baseband receive input signal $R_{BB}$ to one input of a combiner 303, which provides a DC-adjusted receive input signal $R_{ADJ}$ to the input of a baseband BB LPF 305 representing the LPFs 269, 271. The other input of the combiner 303 receives a DC OFFSET signal. The combiner 303 operates as a combiner that combines the DC OFFSET signal with the $R_{BB}$ receive signal to provide the DC-adjusted $R_{ADJ}$ signal. In one embodiment, the combiner 303 is a summing junction that subtracts the DC OFFSET signal from the $R_{BB}$ receive signal to provide the DC-adjusted $R_{ADJ}$ signal. It is noted that the combiner 303 may alternatively operate as a summing junction that adds an inverted DC OFFSET signal. The invention is not limited to any particular implementation or design configuration.

The output of the BB LPF 305 is provided to the input of a baseband gain amplifier BB AGC amplifier 307, representing operation of the BB AGC amplifiers 273, 275. The output of the BB LPF 305 is also provided to the overload detector 289, which asserts the baseband overload signal BB OVLD to the OVLD ADC 291 within the baseband processor 203, which provides the OVLD signal to an overload (OV) detect block 309 of the compensation device 284. The OV detect block 309 asserts the HI/LO signal to the LNA/mixer 301 to switch the variable LNA 261 between high and low gains. The BB AGC amplifier 307 asserts the amplified input signal R to the input of an AA LPF 311 representing the AA LPFs 277, 279. The output of the AA LPF 311 is provided to an ADC 313 representing the ADCs 281, 283. The ADC 313 provides a digital version $R_D$ of the amplified receive input signal R at its output, where the $R_D$ signal represents the I and Q digital receive signals $R_{DI}$ and $R_{DQ}$. The $R_D$ signal from the ADC 313 is provided to the spreading decoder 285.

The $R_D$ signal is provided to a signal power estimate block 315 and a DC estimate block 319 of the compensation logic 284. The signal power estimate block 315 provides a input signal power estimate signal $R_{EST}$ to one input of a combiner 321. The combiner 321 receives a target power (TP) signal from a target power block 323 and combines the TP signal with the $R_{EST}$ signal to provide a receive error signal $R_E$, which is provided to an input of another combiner 325. In one embodiment, the combiner 321 operates as a summing junction that subtracts the TP signal from the $R_{EST}$ signal to provide a receive error signal $R_E$ to an input of the combiner 325. The combiner 325 combines the $R_E$ signal with a gain accumulation signal $G_{ACC}$ from an accumulator 329 to provide the gain adjust signal $G_{ADJ}$ at its output. In one embodiment, the combiner 325 also operates as a summing junction that subtracts the $R_E$ signal from the gain accumulation signal $G_{ACC}$ from an accumulator 329 to provide the gain adjust signal $G_{ADJ}$ at its output. The $G_{ADJ}$ signal is provided to the respective inputs of the AGC DAC 297, the accumulator 329 and a gain converter 331. The AGC DAC 297 converts the digital $G_{ADJ}$ signal to the analog GAIN ADJUST signal, which controls the gain of the BB AGC amplifier 307. The accumulator 329 continuously or periodically adjusts the $G_{ACC}$ signal to track changes of the $G_{ADJ}$ signal.

The DC estimate block 319 provides an output DC estimate digital signal $ODC_{EST}$ to the input of a DC amplifier 333, which is adjusted by a gain conversion signal $G_{CON}$ from an output of the converter 331. The DC amplifier 333 amplifies or attenuates (I/G) the $ODC_{EST}$ signal by an amount determined by the $G_{CON}$ signal from the converter 331, and provides an input DC estimate signal $IDC_{EST}$ to one input of a combiner 335, which receives a DC offset accumulation signal $D_{ACC}$ from an accumulator 339 at its other input. The combiner 335 combines the $IDC_{EST}$ signal with the $D_{ACC}$ signal to provide a DC offset signal $DC_{OFF}$, which is provided to the input of a DC DAC 337 and to the input of the DC accumulator 339. In one embodiment, the combiner 335 operates as a summing junction that adds the $IDC_{EST}$ signal to the $D_{ACC}$ signal to provide the DC offset signal $DC_{OFF}$. The accumulator 339 continuously adjusts the DACC signal to the level of the $DC_{OFF}$ signal to maintain an accumulated DC value. The DC DAC 337 converts the digital $DC_{OFF}$ signal to the analog DC OFFSET signal provided to the combiner 303. The $DC_{OFF}$ signal represents operation of the $IDC_{OFF}$ and $QDC_{OFF}$ signals and the DC OFFSET signal represents operation of the I OFFSET and Q OFFSET signals.

It is noted that many alternatives and variations are contemplated. For example, the combiner 303 may be implemented as a simple summing junction, where the DC amplifier 333 or the DC DAC 337 performs negation or inversion to generate a negative DC OFFSET signal, which is then added to the $R_{BB}$ signal by the combiner 303.

Control logic 343 is coupled to the OV detect block 309, the target power block 323 and the DC estimate block 319 for controlling operations, setting parameters, etc. For example, the control block 343 may be used to enable a manufacturer or user to set a target power level used by the target power block 323 to control the TP signal.

In operation, the $R_{RF}$ signal from the antennas 247, 249 is converted to the $R_{BB}$ signal at baseband frequency by the LNA/mixer 301. The OV detect block 309 initially sets the gain of the LNA portion of the LNA/mixer 301 high by asserting the HI/LO signal to HI in order to ensure detection of a valid but weak RF signal received by either of the antennas 247, 249. The $R_{BB}$ signal is DC adjusted by the combiner 303, which combines or otherwise subtracts the DC OFFSET signal and provides the $R_{ADJ}$ signal to the BB LPF 305. The BB LPF 305 provides a filtered version of the $R_{ADJ}$ signal to the BB AGC amplifier 307. The DC OFFSET signal is based on an estimate of the amount of undesired DC at the input of the BB AGC amplifier 307. The overload detector 289 detects whether an overload condition of the received input signal at the output of the BB LPF 305 exists, and if so, asserts the BB OVLD signal. If an overload condition is detected, the OV detect block 309 asserts the HI/LO signal to LO to reduce the input gain of the LNA/mixer 301 to bring the received input signal $R_{BB}$ closer to a target power level.

The BB AGC amplifier 307 amplifies the $R_{ADJ}$ signal to provide the R signal to the AA LPF 311 and then to the ADC 313 of the baseband processor 203. The ADC 313 converts the analog R signal to the digital receive signal $R_D$, which is provided to the spreading decoder 285 (as the $R_{DI}$ and $R_{DQ}$ signals). The signal power estimate block 315, the combiners 321 and 325, the target power block 323, the accumulator 329 and the AGC DAC 297, in combination with the signal path devices including the BB AGC amplifier 307, the AA LPF 311 and the ADC 313, form the AGC loop 345, which is a gain feedback circuit centered around the BB AGC amplifier 307. The AGC loop 345 includes gain control logic that receives the amplified input signal, that estimates input signal power and that asserts the gain adjust signal in an attempt to keep the input signal power at a target power level. In particular, the signal power estimate block 315 estimates the power of the baseband input signal within the $R_D$ signal and asserts the $R_{EST}$ signal indicative thereof. In one embodiment, this power estimate excludes any DC level of the $R_D$ signal. The combiner 321 compares the $R_{EST}$ signal with the TP signal to generate the $R_E$ signal, which identifies an amount of power error of the $R_D$ signal relative to the target power level represented by the TP signal. The combiner 325 adjusts the present value of the $G_{ADJ}$ signal in an attempt to compensate for any power error that exists. The AGC DAC 297 converts the $G_{ADJ}$ signal to the analog GAIN ADJUST signal, which is provided to the gain control input of the BB AGC amplifier 307 to control the power level of baseband input signal within the $R_D$ signal. Thus, the AGC loop 345 attempts to maintain or otherwise regulate the power level of the input baseband signal within the $R_D$ signal to the target power level.

In the embodiment shown, the BB AGC amplifier 307, representing either of the BB AGC amplifiers 273, 275, uses a logarithmic gain scale, such as measured in dB, that ranges between −6 and 60 dB. The $R_D$ signal is in digital format, so the signal power estimate block 315, the target power block 323, the accumulator 329 and the combiners 321, 325 are digital devices and the $R_{EST}$, TP, $R_E$, $G_{ACC}$ and $G_{ADJ}$ signals are digital signals. The AGC DAC 297 is a 7-bit DAC with 128 steps that outputs an analog current signal with a control current range of approximately ±1 mA to achieve the desired gain range for the BB AGC amplifier 307. The current output of the AGC DAC 297 is converted to a voltage signal, such as by a resistive network or the like (not shown), to obtain the GAIN ADJUST signal.

The DC estimate block 319, the gain converter 331, the DC amplifier 333, the combiner 335, the accumulator 339, the DC DAC 337 and the combiner 303, in combination with the receive signal path between the combiner 303 and the ADC 313, form a DC loop 347 that operates to attempt to reduce or otherwise remove DC from the $R_D$ signal in the input signal path. The DC loop 347 includes DC control logic that estimates an amount of DC in the amplified input signal and provides a DC offset in an attempt to reduce DC in the amplified input signal. In particular, the DC estimate block 319 estimates the DC offset of the $R_D$ signal, and provides the $ODC_{EST}$ signal indicative of the amount of DC at the output of the BB AGC amplifier 307. Since the DC OFFSET signal is applied at the combiner 303 at the input of the BB AGC amplifier 307, and since any remaining DC of the $R_{ADJ}$ signal is effectively amplified by the BB AGC amplifier 307, the DC amplifier 333 operates to compensate for the gain of the BB AGC amplifier 307. The gain converter 331, receiving the $G_{ADJ}$ signal and generating the $G_{CON}$ signal that controls the gain of the DC amplifier 333, operates as a gain interface that converts gain levels between the gain control logic and the DC control logic. In one embodiment, the gain converter 331 inverts the gain (1/G). The gain converter 331 may further compensate for different gain ranges and/or different gain scales between the BB AGC amplifier 307 and the DC amplifier 333. In this manner, the $IDC_{EST}$ signal, asserted by the DC amplifier 333, represents an error of the DC OFFSET signal. The combiner 335 adjusts the $DC_{OFF}$ signal, maintained by the accumulator 339 as the $D_{ACC}$ signal, by the $IDC_{EST}$ signal to compensate for errors in the DC OFFSET signal.

In the embodiment shown, the $R_D$ signal is in digital format, so the DC estimate block 319, the DC amplifier 333, the accumulator 339 and the combiner 335 are digital devices and the $ODC_{EST}$, $IDC_{EST}$, $D_{ACC}$ and $DC_{OFF}$ signals are digital. Also, the DC DAC 337, representing either of the I, Q OFF DACs 293, 295, is a 12-bit, current-based DAC operated in 2's-complement format that outputs an analog current with an approximate range of ±5 milliamps (mA). The DAC output current is converted to the DC OFFSET voltage signal having a range of approximately ±75 mV to compensate for an expected DC offset range of approximately ±64 mV. The gain converter 331 may operate entirely as a digital device to convert the digital $G_{ADJ}$ signal to a digital $G_{CON}$ signal. Alternatively, it is contemplated that the $G_{CON}$ signal is an analog signal depending upon the configuration of the DC amplifier 333. In the embodiment shown, the DC amplifier 333 is a linear gain amplifier. In general, the BB AGC amplifier 307 amplifies the input signal including any DC, so that the DC amplifier 333 operates as an amplifier that amplifies the $ODC_{EST}$ signal to maintain control of the DC loop 347. The amount of amplification by the DC amplifier 333 is controlled by the gain converter 331 via the $G_{CON}$ signal. The gain converter 331 receives the $G_{ADJ}$ signal and adjusts the $G_{CON}$ signal accordingly.

As described previously, the gain converter 331 operates as a gain interface that converts gain levels between the gain control logic and the DC control logic. In one embodiment, the gain converter 331 inverts the gain between the BB AGC amplifier 307 and the DC amplifier 333. The gain converter 331 may further convert between the corresponding ranges or units along with any bit weighting of the $G_{ADJ}$ and $G_{CON}$ signals so that the amplification of the $ODC_{EST}$ signal corresponds to the gain of the $R_{ADJ}$ signal. In the alternative or in addition, the gain converter 331 further converts between gain scales, such as between logarithmic and linear scales. In particular for the embodiment shown, since the BB AGC amplifier 307 is a logarithmic gain amplifier measured in decibels (dBs) and since the DC amplifier 333 is a linear gain amplifier, the gain converter 331 converts from the $G_{ADJ}$ signal in dBs to the linear gain $G_{CON}$ signal. For embodiments in which the BB AGC amplifier 307 and the DC amplifier 333 are both linear amplifiers, the gain converter 331 converts between the corresponding ranges or units along with any bit weighting of the $G_{ADJ}$ and $G_{CON}$ signals without need of logarithmic conversion.

Figure 4:
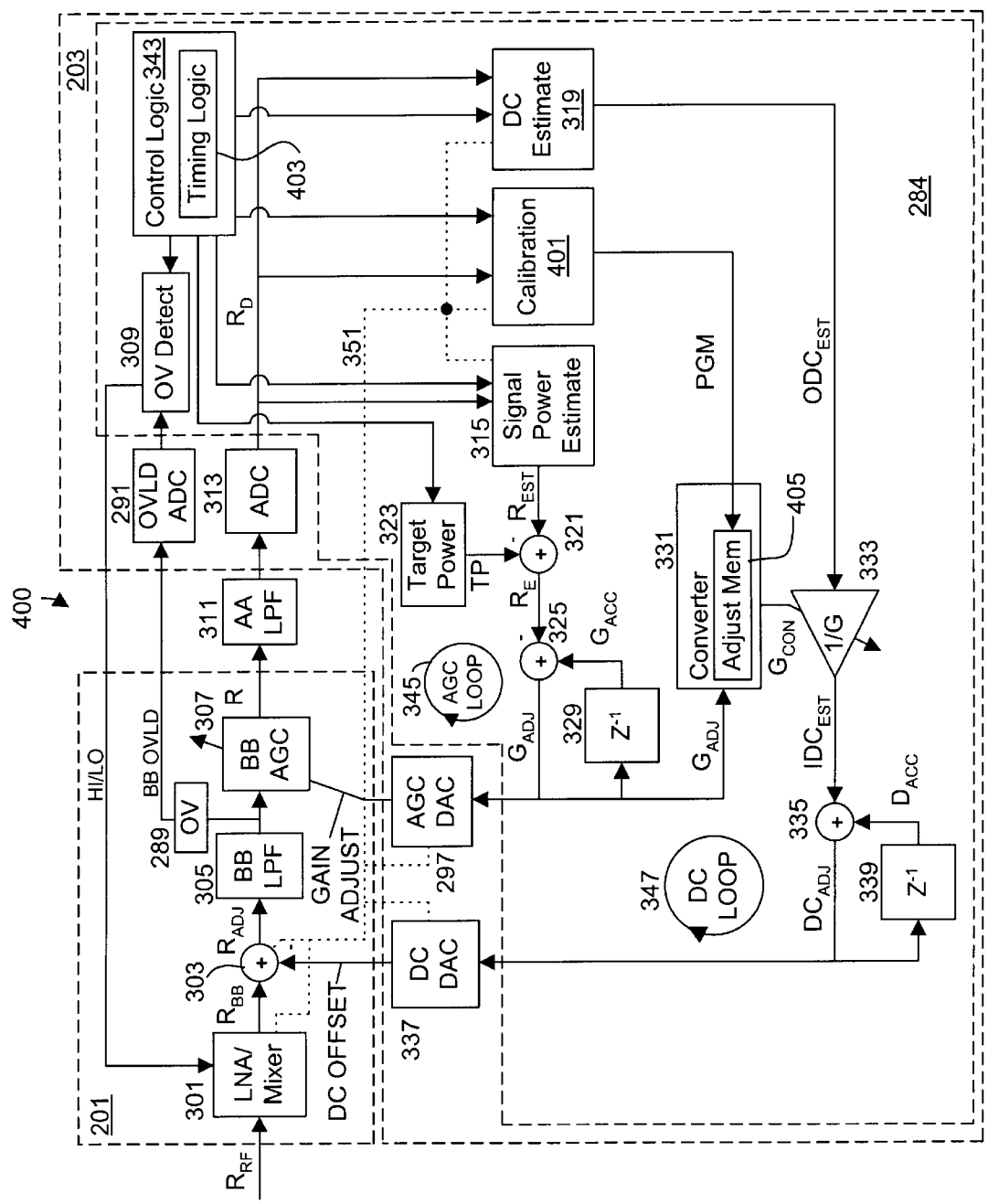
FIG. 4 is a block diagram of a calibrated DC compensation system similar to the compensation system of FIG. 3 that further includes a calibrator that periodically performs a calibration procedure and a programmable adjust memory provided in the gain interface between the gain loop and the DC loop to more accurately determine and control DC.

FIG. 4 is a block diagram of a calibrated DC compensation system 400 similar to the compensation 300 except utilizing calibration to more accurately determine and control DC. In particular, a calibration block 401 comprises calibration logic that receives the $R_D$ signal and provides one or more calibration programming signals, collectively referred to as PGM signals, to the gain converter 331. The gain converter 331 includes an optional adjust memory 405 for storing adjust values as further described below. The PGM signals may be implemented in any suitable manner, such as multiple bus signals or the like to program the adjust memory 405. The control block 343 may also be used to control a calibration procedure or calibration function or to control if and when a calibration procedure is performed by the calibration block 401. For example, the control logic 343 optionally includes timing logic 403 or the like that determines a time interval for performing a calibration procedure, as further described below. The time interval between consecutive calibration operations depends upon the particular configuration or implementation. In the embodiment shown, the calibration time interval is on the order of seconds or minutes, such as approximately 30 seconds or 1 minute or the like.

As previously described, there are many sources of DC, an d the DC level changes over time. The BB AGC amplifier 307 itself introduces DC offset that may change significantly from one gain step to another. In the embodiment shown, the calibration block 401 is a digital device that operates as a calibrator, which monitors the digital $R_D$ signal, makes appropriate measurements and calculations, and programs the adjust memory 405 accordingly. The converter 331 receives the $G_{ADJ}$ signal, determines a corresponding initial value for the $G_{CON}$ signal, and makes any necessary adjustments utilizing adjust values in the adjust memory 405 if provided. The adjust value may be incorporated in any one of several manners. In one configuration, the adjust value is a multiplier value which is multiplied by the initial conversion value determined by the gain converter 331 and the result is used as the $G_{CON}$ signal to control the DC amplifier 333. Alternatively, the adjust value is an offset or additive value that is added to or subtracted from the initial conversion value determined by the gain converter 331 and the sum is used as the $G_{CON}$ signal to control the DC amplifier 333. In alternative embodiments, the calibration block 401 may simply assert a calibration signal that is used for adjusting the $G_{CON}$ signal. The calibration signal is maintained at a current adjust level as controlled by the calibration block 401, and utilized by the gain converter 331 in a similar manner as a single adjust value. It is noted, however, that due to the unpredictable and often non-linear nature of DC voltage in ZIF architecture embodiments in many environments, a single-valued calibration signal may not be sufficient to compensate for DC.

Any suitable number of adjust values are contemplated to achieve any desired level of accuracy. In one configuration, a low gain adjust value and a high gain adjust value are used. The particular $G_{ADJ}$ value that is used as the threshold to switch between the low and high adjust values may be determined arbitrarily or experimentally. A half-way point is contemplated, although any suitable threshold point is contemplated depending upon the particular configuration and design. Alternatively, any number of adjust values could be used for each of a corresponding number of gain steps or levels of the $G_{ADJ}$ signal. If the AGC DAC 297 is a 7-bit DAC with 128 corresponding discrete gain steps, for example, then the number gain adjust values programmed into the adjust memory 405 may range from 2 to 128 different adjust values. The embodiment of a different adjust value for each discrete gain step of the $G_{ADJ}$ signal provides relatively high accuracy.

Upon timeout of the timing logic 403, the control logic 343 determines whether the wireless transceiver 200 is performing any communication functions, such as sending or receiving any packets of information. If not busy, or after the wireless transceiver 200 has performed its functions and becomes idle, the control logic 343 indicates to the calibration block 401 to conduct a calibration procedure. The calibration block 401 is coupled to control certain functions of the wireless transceiver 200, as indicated by dotted line 351, to conduct calibration. During calibration, the calibration block 401 may control the LNA/mixer 301 and/or the combiner 303 to temporarily remove the input signal $R_{BB}$ from the compensation system 300. For example, the input of the combiner 303 that receives the $R_{BB}$ signal is temporarily disconnected from the LNA/mixer 301 and grounded or otherwise left floating. It is noted, however, that control of the LNA/mixer 301 and/or the combiner 303 may require a more complicated interface between the ZIF transceiver 201 and the baseband amplifier 203. Alternatively, the calibration procedure and functions may be wholly contained within the baseband processor 203. In either case, the calibration block 401 controls the DC DAC 337 and the AGC DAC 297 to temporarily disable the AGC loop 345 and the DC loop 347 to conduct the calibration procedure.

During the calibration procedure, the calibration block 401 controls the DC DAC 337 to inject a predetermined or arbitrary DC level or setting into the compensation system 300, such as a DC value of zero volts or any other predetermined or suitable voltage. The calibration block 401 controls the AGC DAC 297 to a predetermined gain step or level, or otherwise to consecutively step through one or more gain steps. The calibration block 401 then samples the $R_D$ signal one or more times for each gain step. From this data, the calibration block determines one or more gain values or otherwise determines one or more DC offset values corresponding DC levels of the $R_D$ signal. In some embodiments, the calibration block 401 makes any necessary calculations based on measured parameters, such as DC levels of the $R_D$ signal and/or gain of the BB AGC amplifier 307, and programs the adjust memory 405 with one or more adjust values accordingly.

In one embodiment, the calibration block 401 controls the DC DAC 337 to assert an arbitrary and known DC voltage to the combiner 303 and controls the AGC DAC 297 to a particular gain level. The calibration block 401 then samples the $R_D$ signal. The calibration block 401 may use an assumed or theoretical gain of the BB AGC amplifier 307, calculate the theoretical value of the $R_D$ signal based on the gain level, and compare with the actual value of measured $R_D$ signal. The difference between the theoretical gain value and the measured value is a DC differential value that is utilized to determine the necessary DC offset at that gain level. Alternatively, the calibration block 401 determines one or more gain values representing measured gain of the BB AGC amplifier 307 in any appropriate manner, and uses the determined gain values rather than theoretical gain in the calculation. For example, the calibration block 401 may determine first and second DC offset values programmed into the DC DAC 337 that result in the $R_D$ signal reaching corresponding first and second range values, such as 75 % upper and lower range values, respectively. As described further below, the first and second DC offset values are utilized to calculate a gain value of the BB AGC amplifier 307 at the particular gain step of the AGC DAC 297.

The calibration block 401 repeats the process for one or more gain steps of the AGC DAC 297 resulting in a plurality of gain values and DC differential values that are used to determine the adjust values programmed into the adjust memory 405. The calibration block 401 may incorporate any differences in gain ranges or gain scales between the BB AGC amplifier 307 and the DC amplifier 333 to convert each DC differential value to the appropriate adjust value. For example, conversion from logarithmic to linear scales is contemplated. Alternatively, the adjust memory 405 is programmed with the DC differential values, where the gain converter 331 performs any necessary conversions during operation. Although the calibration block 401 and the adjust memory 405 are additional components that further complicate the circuitry and logic, the DC loop 347 converges and eliminates the DC offset more quickly. The calibration procedure is repeated on a periodic basis since the operating environment is dynamic and unpredictable.

Figure 5:
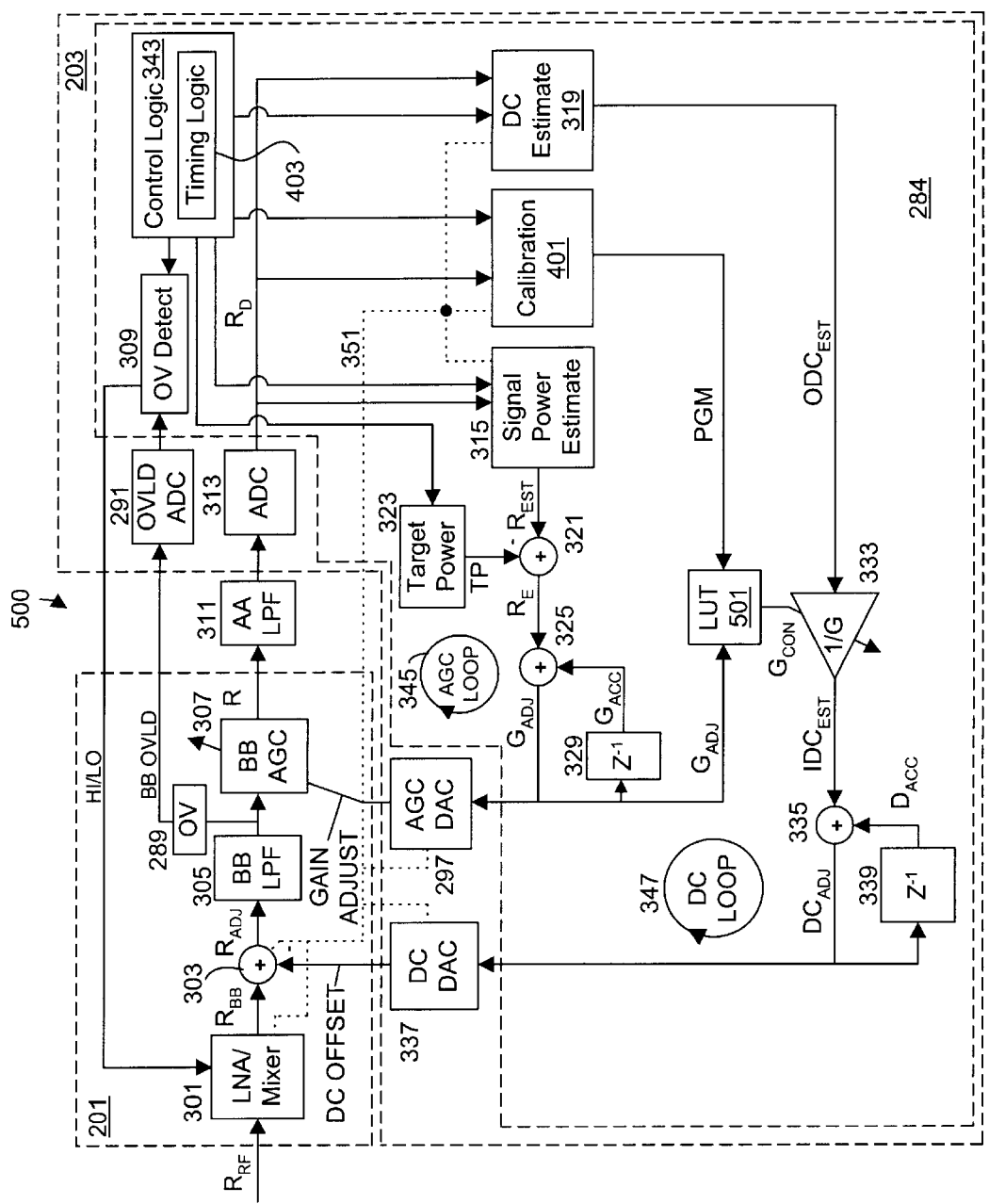
FIG. 5 is a block diagram of a calibrated compensation system similar to the compensation system of FIG. 4 that uses a lookup table as the gain interface between the gain loop and the DC loop.

FIG. 5 is a block diagram of a calibrated compensation system 500 similar to the compensation system 400, except that the gain converter 331 is replaced by a lookup table (LUT) 501 as the gain interface between the AGC loop 345 and the DC loop 347. The LUT 501 is a memory device that operates in a similar manner as the gain converter 331 and adjust memory 403, except that gain conversion values programmed in the LUT 501 are asserted directly as the $G_{CON}$ signal to control the gain of the DC amplifier 333. In particular, the $G_{ADJ}$ signal is used as an address to access a gain conversion value within the LUT 501, which is then asserted as the $G_{CON}$ signal to the DC amplifier 333. The calibration block 401 performs the calibration procedure in a similar manner as previously described to determine one or more gain values or DC offset values via the $R_D$ signal.

The calibration block 401 performs any necessary calculations on the measured gain values and/or DC offset values to convert between the AGC loop 345 and the DC loop 347 to program the gain conversion values within the LUT 501. In particular, the calibration block 401 converts between corresponding ranges or units along with any bit weighting of the $G_{ADJ}$ and $G_{CON}$ signals as previously described. In the alternative or in addition, the calibration block 401 further converts between different scales, if any, between the BB AGC amplifier 307 and the DC amplifier 333, such as between logarithmic and linear scales as previously described. The calibration block 401 programs a separate gain conversion value within the LUT 501 that corresponds to at least one gain level or step of the AGC DAC 297. A separate gain conversion value for each gain step is contemplated, which provides an advantage during operation in that no conversion is necessary so that the LUT 501 supplies an appropriate $G_{CON}$ value for every $G_{ADJ}$ value.

Figure 6:
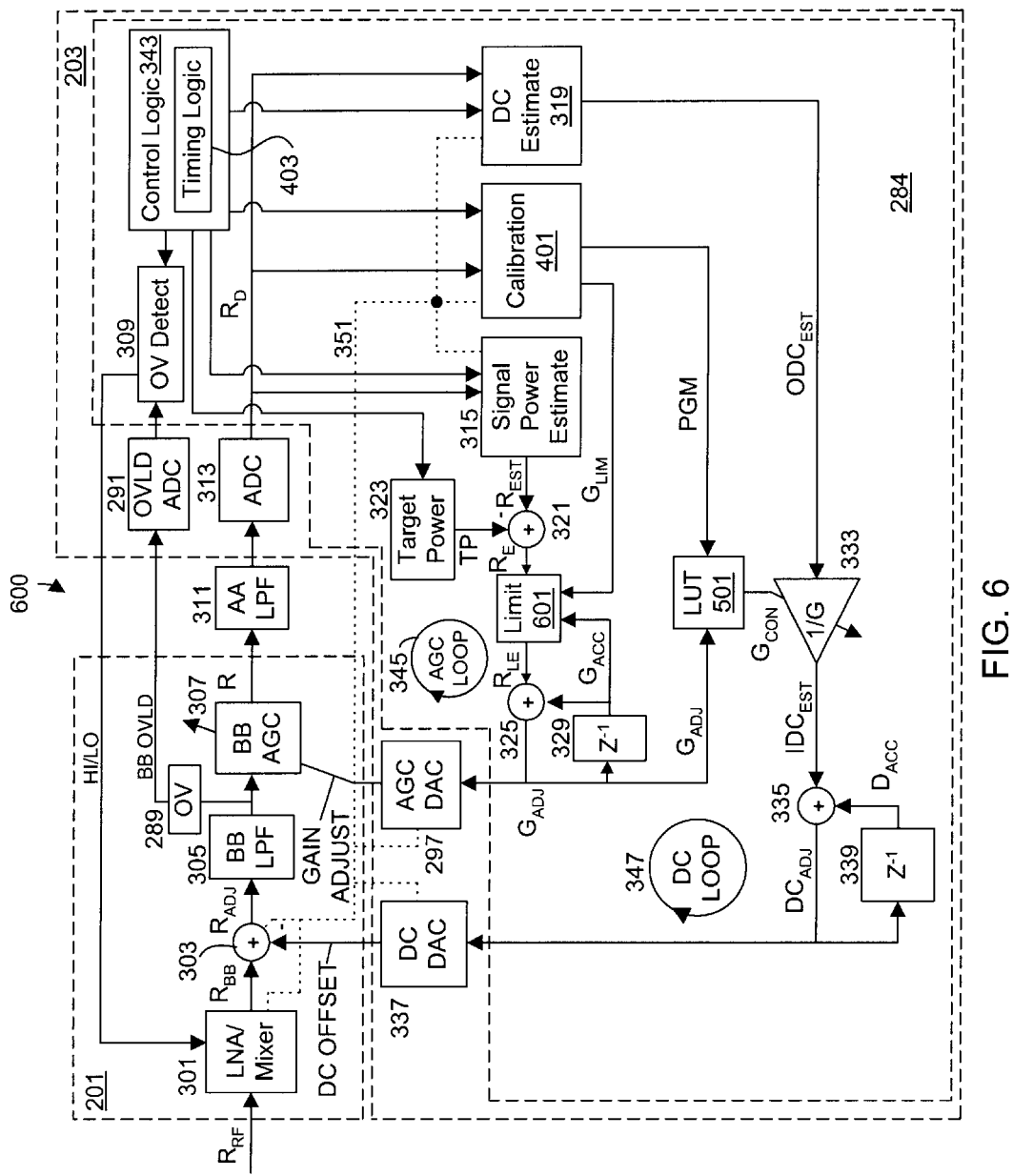
FIG. 6 is a block diagram of a calibrated compensation system similar to the compensation system of FIG. 5 with the inclusion of a limit block in the gain loop to limit gain change.

FIG. 6 is a block diagram of a calibrated compensation system 600, which is similar to the compensation system 500, but that further includes a limit block 601 that operates as a gain adjust limiter to limit change of the $G_{ADJ}$ signal during operation. The $R_E$ signal from the combiner 321 is provided to the limit block 601, which also receives the $G_{ACC}$ signal from the accumulator 329. The limit block 601 asserts a limited receive error signal, referred to as $R_{LE}$, to the accumulator 325 rather than the $R_E$ signal. In this manner, the $R_{LE}$ signal is a limited version of the $R_E$ signal as determined by the limit block 601 using the $R_E$ signal and the $G_{ACC}$ signal. The $G_{ACC}$ signal is the current gain level of the AGC DAC 297 (via the $G_{ADJ}$ signal) and the $R_E$ signal is the desired error differential or change to determine a new level of the $G_{ADJ}$ signal. The accumulator 329 updates the $G_{ACC}$ signal with the new value of the $G_{ADJ}$ signal after being changed.

Instead of directly applying the $R_E$ signal, the limit block 601 provides a way of limiting the amount of change of the $G_{ADJ}$ signal to prevent loss of loop control, as further described below. Many different embodiments are contemplated. In one embodiment, the limit block 601 is preprogrammed with a predetermined gain change limit that always applies, such as a 90% factor applied to the $R_E$ signal or the like, or a constant maximum gain change limit that is not exceeded during operation of the wireless transceiver 200. Alternatively, the limit block 601 is programmed by the calibration block 401 via one or more $G_{LIM}$ signals or the like, in a similar manner described above for the LUT 501.

It is possible that the ADC 313 include as many bits as necessary to capture most, substantially all, or all possible ranges of the receive signal R asserted by the BB AGC amplifier 307. In a particular embodiment, the BB AGC amplifier 307 has a gain range of approximately 66 dB (−6 dB to 60 dB) to provide a sufficient dynamic gain range to enable appropriate operation in the anticipated environments. The AGC DAC 297 includes a sufficient number of bits to achieve the desired accuracy over the entire gain range of the BB AGC amplifier 307. For example, in one embodiment, the AGC DAC 297 is 7 bits. Such configuration would require that the ADC 313 has a significantly large number of bits to track the receive signal R regardless of the gain level of the BB AGC amplifier 307. It is further noted that the ADG 313 could further include additional bits to further incorporate the entire range of DC offsets incorporated within the receive signal that might not yet be completely compensated for by the DC loop 347. Again, this is a substantially large number of bits that would require a large ADC 313. Further, the baseband processor 203 could be designed to appropriately handle the significantly large number of bits of the ADC 313.

In a more practical embodiment, the ADC 313 includes only as many bits as necessary to maintain signal integrity with sufficient head and foot room (collectively, head room). In one embodiment, for example, the ADC 313 is a 6-bit converter with a 36 dB of range resulting in approximately 6 dB per bit. In this manner, the ADC 313 does not attempt to handle the entire operating range of the BB AGC amplifier 307, but instead is sufficient to maintain signal integrity with sufficient head room. The target power block 323 asserts the TP signal at the appropriate target power in an attempt to maintain the receive signal R with reduced or eliminated DC offset to within the operating range of the ADC 313. It is noted that the target power is less than the full scale of the ADC 313 and in one embodiment is set to approximately ±75 percent of the full scale power observable with the ADC 313.

The ZIF transceiver 201, therefore, may provide a received R signal that is beyond the range of the ADC 313 of the baseband processor 203. This may be particularly true during initial packet acquisition. For example, an excessive DC level may cause the ADC 313 to rail to either its maximum or minimum limits. An overpowered input receive signal may cause clipping at either or both rails depending upon corresponding DC level. The AGC loop 297 and the DC loop 347 are provided to compensate for signal power and DC level to control the level of the $R_D$ signal to within the desired target power and operating range of the baseband processor 203. Furthermore, even after the $R_D$ signal converges to the desired operating range, the environmental conditions may suddenly change causing a change of signal power and/or DC level. Since the BB AGC amplifier 307 has unpredictable DC at its input that may change significantly with gain level changes, significant gain changes requested by the signal power estimate block 315 may otherwise cause a substantial change of the DC level of the $R_D$ signal causing a rail condition of the ADC 313 and/or loss of DC loop 347 control. This is particularly problematic at high gain levels, since any new DC level is substantially amplified at high gain by the BB AGC amplifier 307 potentially causing quick loss of loop control.

The limit block 601 is provided in the compensation system 600 to reduce or eliminate over-correction by the signal power estimate block 315. At higher level gain steps of the AGC DAC 297 corresponding to higher gain levels of the BB AGC amplifier 307, a certain level of the REST signal may correspond to a significant amount of differential of the $G_{ADJ}$ signal and the AGC DAC 297, which could introduce too much DC offset for control by the DC loop 347. Alternatively, a significant change in the $G_{ADJ}$ signal may substantially reduce DC offset otherwise supplied by the BB AGC amplifier 307, such that the accumulated DC offset signal itself over-compensates and thus introduces too much DC voltage that may not be controllable. Thus, the limit block 601 reduces the amount of correction of the $R_E$ signal at higher gain steps. The limit block 601 compares the $R_E$ signal with the $G_{ACC}$ signal and determines the level of the $R_{LE}$ signal to maintain a controllable modification of the $G_{ADJ}$ signal to maintain proper control loop operation.

Many different embodiments and variations of the limit block 601 are contemplated. In one embodiment, the limit block 601 is pre-programmed with a single maximum gain differential value that is applicable for all operating gain levels. Alternatively, the limit block 601 is programmed by the calibration block 401 via the $G_{LIM}$ signals during calibration with one or more gain limit values. A single maximum gain change limit GM is contemplated as determined and programmed by the calibration block 401. One or more gain change limits may also be determined and programmed depending upon particular gain steps. The limit block 601 may be programmed with a different gain change limit for each gain step of the $G_{ADJ}$ signal, operable in a similar manner as the LUT 501. Alternatively, the limit block 601 may be programmed with gain change limit values only at higher gain levels, such as the higher 30 dB gain levels. Alternatively, the limit block 601 may be implemented with any combination of gain limitations, including a maximum gain change limit operative across the entire gain range and particular gain change limits at particular gain levels, such as the higher gain levels.

As mentioned previously and as further described below, in one embodiment, the calibration block 401 measures or otherwise determines a gain value representing the gain of the BB AGC amplifier 307 for each gain step of the $G_{ADJ}$ signal (or gain step of the AGC DAC 297) during each calibration procedure. The calibration block 401 may then use an upper bound method that further utilizes an assumed DC offset model or characteristic of the BB AGC amplifier 307. In the assumed model, the change of DC offset (dV) is linear with linear gain change (dG), so that it is assumed that the rate of change of the DC offset is constant with respect to voltage gain, or dV/dG=k, where prefix "d" denotes a derivative or delta value. Using the model, it is assumed that the rate of change of DC offset with respect to voltage gain is the constant value "k". Although this may not be true for particular configurations of the BB AGC amplifier 307, this model is sufficiently accurate from an upper bounding perspective. The linear DC offset change model, when converted to the decibel range ($dV/dG_{dB}$), is no longer linear and changes more rapidly with increasing gain dB. However, over small ranges of gain, the linear approximation is a relatively accurate estimation of the change of DC offset at any given gain point. The rate of change is relatively small at lower gain points but begins to increase rapidly at the mid range point of approximately 30 dB. Thus, correction may be applied over the entire gain range or at the higher gain levels.

To achieve a relatively accurate slope for $dV/dG_{dB}$, it is desired to find the differences in DC and gain at two relatively close points. For convenience, the two points are the current operating gain $G1_{dB}$ and the gain at one (1) dB greater, or $G2_{dB}=G1_{dB}+1$. In this manner, $dG_{dB}=1$ dB, which is simpler for implementation purposes and sufficiently accurate. To find dV (or delta DC), the linear curve with constant "k" is utilized at two gain points by converting between the linear model and dB scales. First, the linear gain G1=invlog $G1_{dB}=10^{\wedge}(G1_{dB}/20)$, where the "^" symbol denotes a power factor or "raised to the power of". The first DC offset DC1=k*G1, where an asterisk "*" represents multiplication. If $G2_{dB}=G1_{dB}+1$, then the second DC offset DC2=k(G2)=k10^[($G1_{dB}$+1)/20]. Thus, dV=DC2−DC1=dV/$dG_{dB}$.

The gain change limit, referred to as MaxGainStep, is the step in gain from an initial operating point that results in extra DC that is the largest observable at the ADC 313. If DC is initially fairly well compensated, then the largest tolerable extra DC is half the range of the ADC 313, referred to as MaxDCStep. In this manner, MaxGainStep for the current gain step is MaxGainStep=MaxDCStep/($dV/dG_{dB}$). The ADC 313 has a range of approximately ±500 mV, so that MaxDCStep=500 mV is an acceptable limit value for the embodiment shown. In one embodiment, a separate $dV_i$, denoted with index "i", is measured for each gain level or gain step (i) of the BB AGC amplifier 307, or each gain step of the $G_{ADJ}$ signal. A corresponding MaxGainStep$_i$ value is then determined for each gain step (i). In one embodiment, all of the MaxGainStep$_i$ values are stored within the limit block 601 by the calibration block 401. For an ADC DAC 297 of 7 bits, 128 different MaxGainStep$_i$ values are calculated and stored. Alternatively, a subset of MaxGainStep$_i$ values are calculated and stored, such as the gain steps corresponding to the upper 30 dB gain range of the BB AGC amplifier 307. In operation, the current gain as determined by the $G_{ACC}$ signal is used to access the corresponding MaxGainStep$_i$ value, if any, stored within the limit block 601 in a similar manner as a lookup table embodiment. The $R_{LE}$ signal is asserted by the limit block 601 as the lesser of the current $R_E$ signal and the corresponding MaxGainStep$_i$ value. In another alternative embodiment, each $dV_i$ is calculated, but only the maximum value is stored, or $dV_M$. Then, a maximum gain change limit, or $G_M$, is calculated using $dV_M$, and stored in the limit block 601 and used over the entire gain range.

In another alternative embodiment, the linear model is not used in favor of actual DC offset measurements. In the embodiment shown, the AGC DAC 297 is a current-based, 7-bit DAC with GD_lsb=approximately 2/128 mA per step or click for a full-scale range of 2 mA, where GD_lsb represents the least significant bit (lsb) conversion value for the AGC DAC 297. If "i" is an index representing the gain steps of the $G_{ADJ}$ signal corresponding to the AGC DAC 297, if Vo(i) represents a measured DC offset at a particular gain level at operating point (i), and if $dG_{mA}$ is the gain change in milliamps, then $dV/dG_{mA}(i)$ for each gain step (i) is determined according to the following equation (1):

$$dV/dG_{mA}(i) = \frac{V_o(i+1) - V_o(i-1)}{2*GD\_Isb} \quad (1)$$

where the quantity Vo(i+1)–Vo(i−1) is a local DC offset change over two gain steps as would be observed after the BB AGC amplifier 307 at the input to the ADC 313. The conversion from mA to dB is nearly linear, where $dV/dG_{dB}(i)$ for each gain step is determined by conversion of $dV/dG_{mA}(i)$ according to the following equation (2):

$$dV/dG_{dB}(i) = \frac{2*(dV/dG_{mA}(i))}{\max G_{db}(i) - \min G_{db}(i)} \quad (2)$$

where $\max G_{db}(i)$ and $\min G_{db}(i)$ are the maximum and minimum measured gain values in decibels, respectively. Then $dV/dG_{dB}(i)$ is determined according to the following equation (3):

$$dV/dG_{dB}(i) = \frac{V_o(i+1) - V_o(i-1)}{\max G_{db}(i) - \min G_{db}(i)} \quad (3)$$

Figure 7:
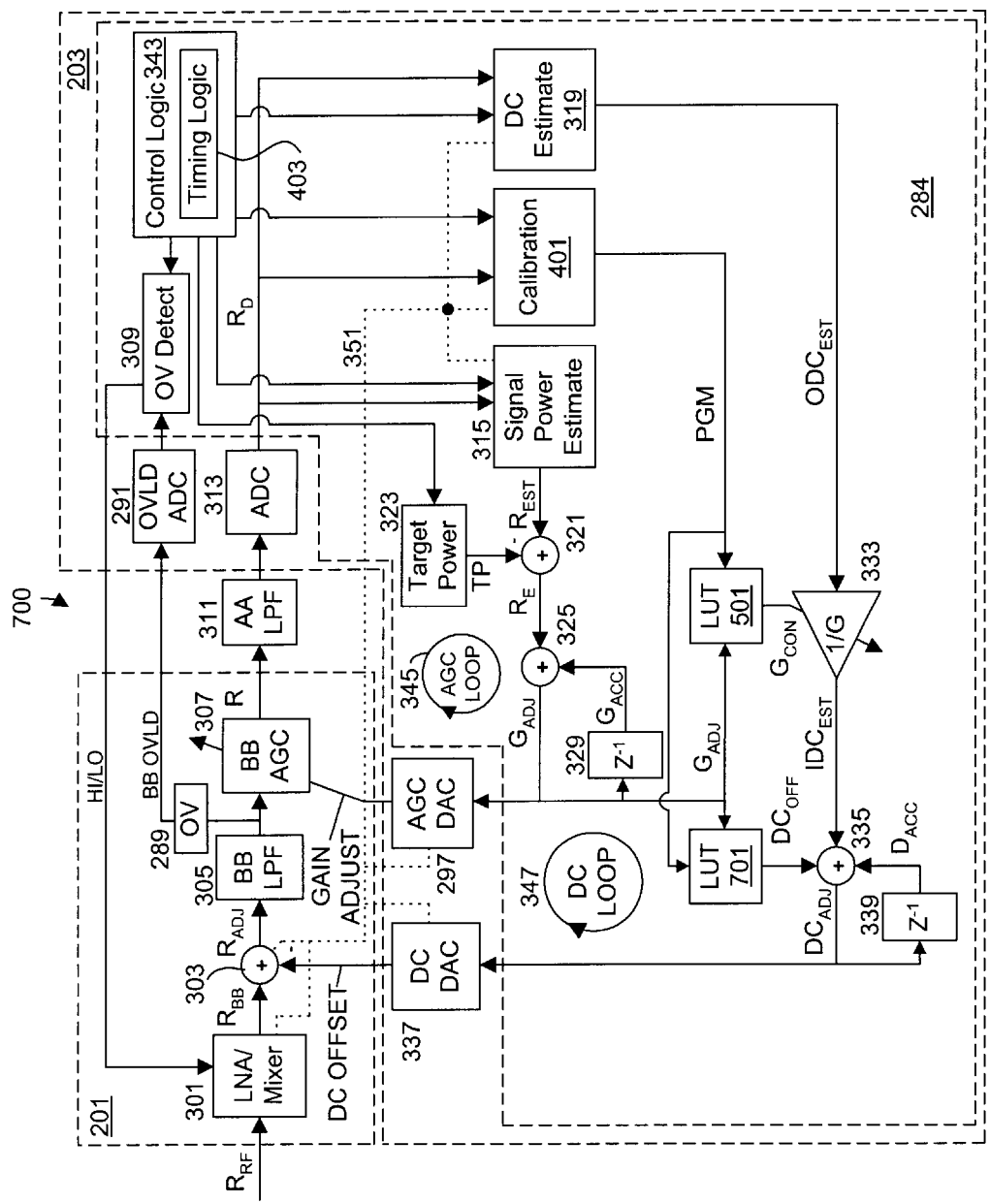
FIG. 7 is a block diagram of a calibrated compensation system similar to the compensation system of FIG. 5 with the inclusion of an additional lookup table that stores and provides one or more DC adjust values to further adjust the DC loop.

FIG. 7 is a block diagram of a calibrated compensation system 700 that is similar to the compensation system 500 with the inclusion of an additional lookup table (LUT) 701. The LUT 701 is another memory device that stores and asserts measured DC adjust values on a signal $DC_{OFF}$ to another input of the combiner 335. The $G_{ADJ}$ signal is provided to an input of the LUT 701, which is programmed by the calibration block 401 with the DC adjust values via the PGM signals. The DC adjust values represent measured DC offsets for corresponding gain steps (i) of the $G_{ADJ}$ signal. In the calibrated compensation systems 500–600, the $IDC_{EST}$ signal asserted by the DC amplifier 333 is a gain compensated DC signal that does not account for measured DC levels. The LUT 701 provides additional correction based on measured DC levels. For example, gain changes by the $G_{ADJ}$ signal are handled by the LUT 501 and measured DC offsets at the gain steps are handled by the LUT 701. Although an additional combiner could be added, the LUT 701 conveniently provides direct DC offset correction to the combiner 335 for more directly controlling the $DC_{ADJ}$ signal and the DC OFFSET signal via the DC DAC 337. The limit block 601 could also be added, but is deemed unnecessary since measured DC offsets are compensated via the LUT 701 in the compensation system 700.

Figure 8A:
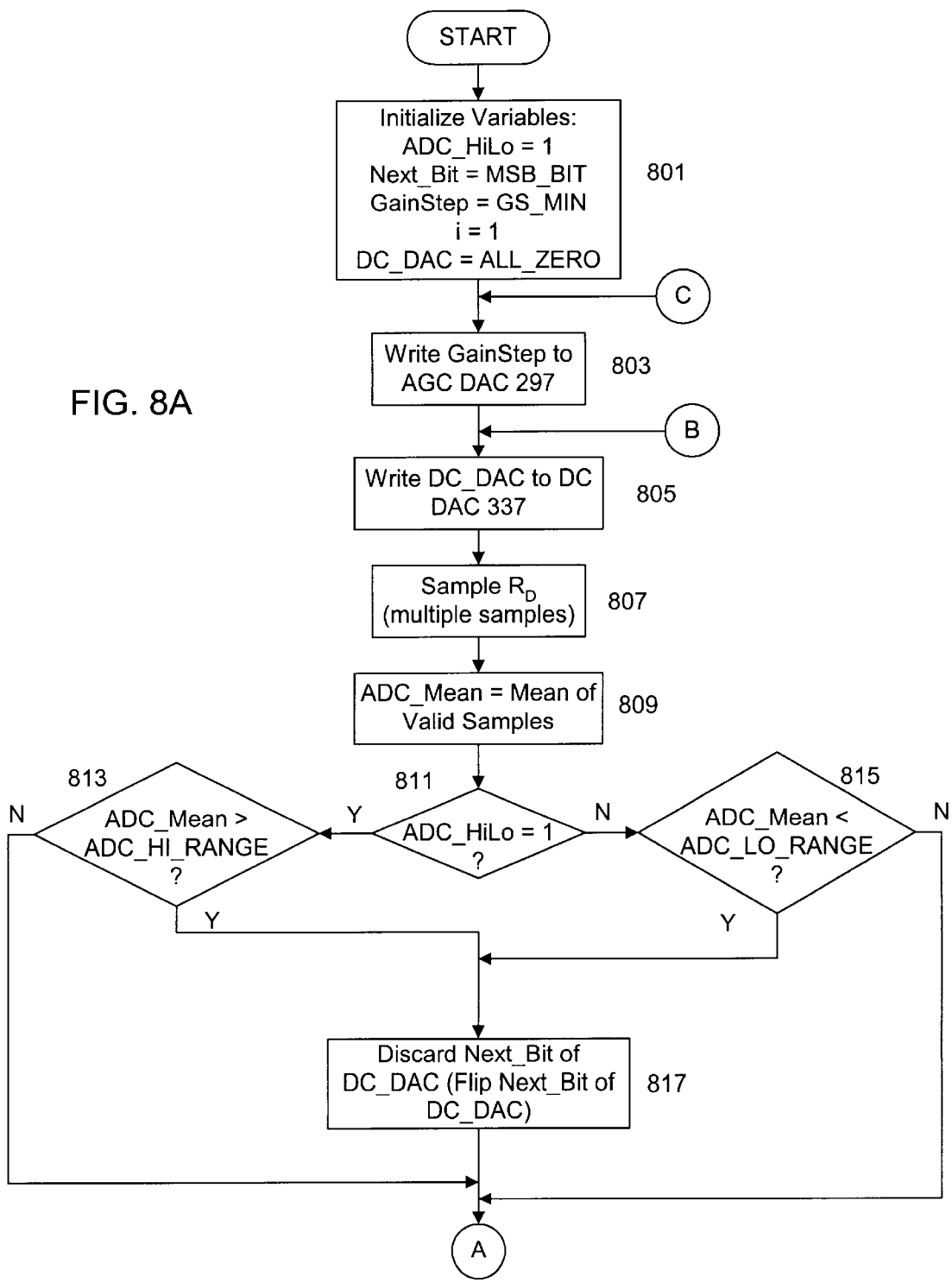
FIGS. 8A–8C are flowchart diagrams illustrating a calibration procedure according to an embodiment of the present invention that determines gain, DC offset and derivative data.
Figure 8B:
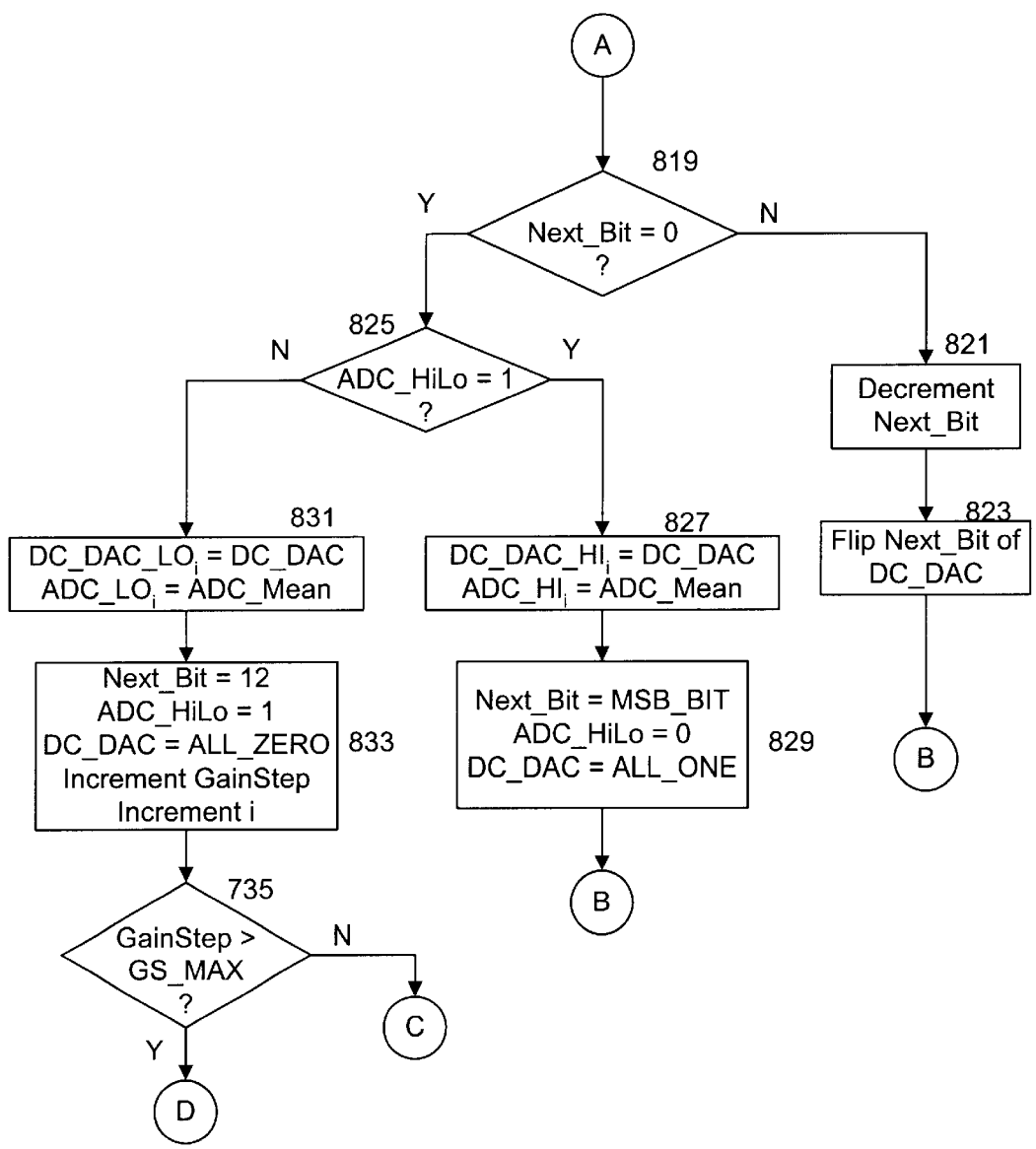
Figure 8C:
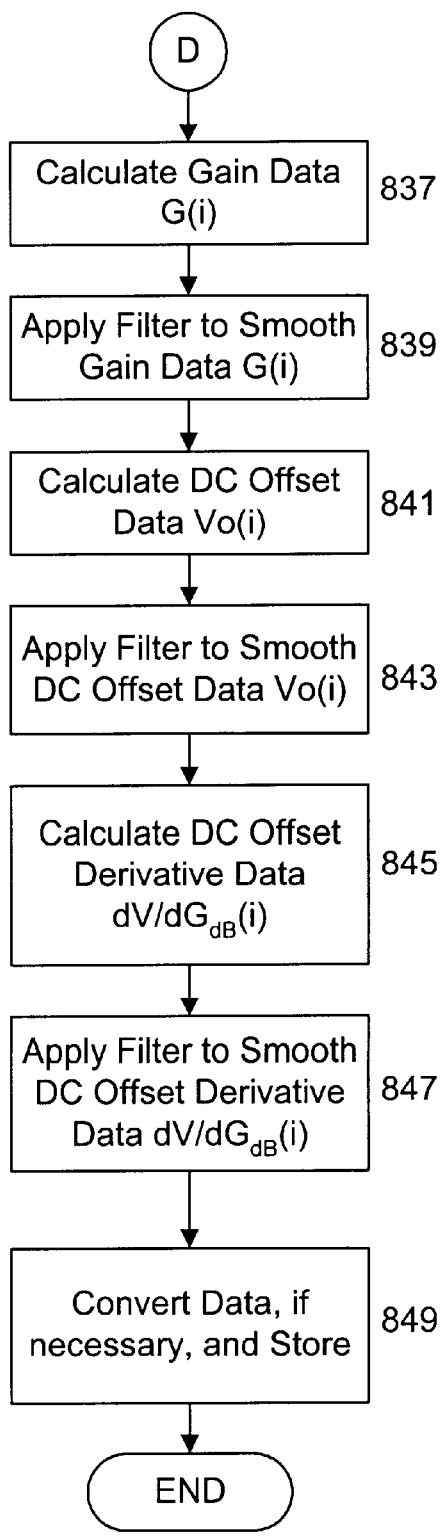

FIGS. 8A–8C are flowchart diagrams illustrating a calibration procedure according to an embodiment of the present invention. This particular calibration procedure measures both the gain of the BB AGC amplifier 307 at each of the gain steps (i) of the AGC DAC 297 and further measures the corresponding DC offset of the $R_D$ signal. Further, the change in DC offsets and/or DC offset derivatives are determined for use by the limit block 601, if desired.

Prior to discussing specific operation, a brief discussion of the overall operation is provided. As described before, the calibration block 401 controls the AGC DAC 297 and the DC DAC 337 to perform measurements while the wireless transceiver 200 is idle and not communicating. A successive approximation algorithm is utilized to establish a voltage difference at the BB AGC amplifier 307 input that corresponds to a desired voltage difference of the $R_D$ signal. During the calibration procedure, the AGC DAC 297 is stepped through each gain step (i) beginning from lowest to highest. Then, for each gain step, the DC DAC 337 is adjusted to obtain a target level of the $R_D$ signal output by the ADC 313. In the particular embodiment described, high and low values of the $R_D$ signal are determined by successive approximation and stored for each gain step of the AGC DAC 297. The use of two separate target levels of the $R_D$ signal enables calculation of the gain using differences in which the DC offsets are common mode and cancel out. Also, utilizing summation in conjunction with the previously calculated gain, the actual DC offset voltage may be calculated.

For the successive approximation, the value of the DC DAC 337 is initially started low and successively increased until the $R_D$ signal is sampled at a predetermined high value. Then, the DC DAC 337 is initially started high and successively decreased until the low value of the $R_D$ signal is sampled at a predetermined low value. A successive approximation or binary search method is used in order to converge on the desired value very quickly. In particular, each bit beginning with the most significant bit (MSB) to the least significant bit (LSB) is flipped and examined independently until the $R_D$ signal is less than or equal to the high value or greater than or equal to the low value.

Referring to FIG. 8A, several variables used in the calibration procedure are initialized at a first block 801. For each gain step, a binary variable ADC_HiLo is used to distinguish between the high and low target values. It is initially set equal to 1. A Next_Bit variable is utilized to step through each bit of the DC DAC 337 in the successive approximation algorithm. The Next_Bit variable is initially set equal to MSB_BIT to point to the most significant bit of the DC DAC 337. In the embodiment shown for the compensation systems 300–700, the DC DAC 337 is 12 bits so that MSB_BIT is set equal to 12. A GainStep variable is utilized to track each gain step of the AGC DAC 297 for controlling the BB AGC amplifier 307. The GainStep variable is initially set equal to GS_MIN or the lowest setting of the AGC DAC 297. In the embodiment shown, GS_MIN is −64 and is incremented to the highest gain step or GS_MAX, which is 63 in the embodiment shown. The index variable "i" is used as an index for storing variables for calculations performed after each calibration procedure and tracks the GainStep variable. A DC_DAC variable is utilized to track the value programmed into the DC DAC 337 for successive iterations. In the embodiment shown, DC_DAC is a 12-bit variable represented in signed 2's complement form that ranges from 100000000000b to 011111111111b, where "b" represents a binary value. The binary range represents a decimal range of −2048 to +2047.

At block 801, DC_DAC is initially set equal to ALL_ZERO which means that all 12 bits of DC_DAC are set equal to binary zero. In signed 2's complement form, this also represents a binary and a decimal value of zero (0). In the first iteration of the calibration procedure, the DC DAC 337 is increased from the lowest value of −2048 and successively increased until the $R_D$ signal becomes equal to a ADC_HI_RANGE constant, which in the embodiment shown is +24. If the DC DAC 337 is to increase from −2048 towards the maximum value of +2047 in the successive approximation, then it is first set approximately equal to the mid-range value of zero. At next block 803, the GainStep variable is written to the AGC DAC 297 to set the gain of the BB AGC amplifier 307 at its lowest level. At next block 805, the DC_DAC variable is written to the DC DAC 337. In this manner, in the first iteration, the AGC DAC 297 is at the lowest gain step and the DC DAC 337 is set equal to zero or at its mid-range level.

At next block 807, the $R_D$ signal is sampled one or more times by the calibration block 401. At next block 809, the arithmetic mean value of valid samples taken at block 807 is stored in a variable ADC_Mean. In the embodiment shown, 48 samples are taken at block 807 and the first 16 are discarded, so that the last 32 samples are considered valid. Thus, the mean value of the last 32 samples is determined and ADC_Mean is set equal to the determined mean value.

At next block 811, it is queried whether ADC_HiLo is equal to 1. Since ADC_HiLo was set equal to one at block 801 during the first iteration, operation proceeds to next block 813, in which it is queried whether the ADC_Mean variable is greater than the ADC_HI_RANGE constant. As described previously, each bit of the DC DAC 337 using the DC_DAC variable is successively tested for each gain step, which in the first iteration is the minimum gain step of GS_MIN, until the $R_D$ signal reaches the ADC_HI_RANGE constant. If the ADC_Mean value has increased beyond ADC_HI_RANGE as determined at block 813, then operation proceeds to next block 817 in which the Next_Bit of the DC_DAC variable is discarded. To discard a bit, its value is changed or "flipped", where if it is 0, it is changed to 1 and vice-versa. In effect, the bit is discarded if the mean value has overshot the target value of ADC_HI_RANGE constant. For example, in the first iteration where Next_Bit is equal to 12 in the embodiment shown and initially set to 0, if the mean value ADC_Mean is greater than the ADC_HI_RANGE constant (+24), then the $12^{th}$ or most significant bit of the DC_DAC variable is flipped "back" to 1 to discard the bit. If this occurs, then DC_DAC becomes equal to 100000000000b or the minimum value of −2048. Otherwise, if the ADC_Mean value is not greater than the ADC_HI_RANGE constant, then block 817 is skipped so that the Next_Bit or bit 12 remains at 0.

Referring to FIG. 8B, if ADC_Mean is not greater than the ADC_HI_RANGE constant as determined at block 813 or after the Next_Bit is discarded at block 817, operation proceeds to block 819 in which it is queried whether Next_Bit is equal to zero. If not, operation proceeds to next block 821 in which Next_Bit is decremented. In the first iteration, Next_Bit is decremented to 11 to test the next bit of DC_DAC in the successive approximation. In this manner, each bit of the DC DAC 337 is tested until the Next_Bit becomes equal to 0 as determined at block 819. At next block 823, the Next_Bit of DC_DAC is flipped for evaluation. In the first iteration, the Next_Bit or bit 11 of DC_DAC is set equal to 1 so that the DC_DAC variable is increased in value according to the successive approximation algorithm. In particular, had the $12^{th}$ bit been discarded at block 817 so that DC_DAC became equal to 100000000000b or −2048, then DC_DAC is set equal to 110000000000b or −1024 at block 823. Otherwise, had the $12^{th}$ bit not been discarded as determined at block 813 so that DC_DAC remained at zero, then DC_DAC is set equal to 010000000000b or +1024 at block 823.

After the Next_Bit of DC_DAC is flipped at block 823, operation proceeds back to block 805 to write the new value of DC_DAC to the DC DAC 337. Operation loops in this manner between blocks 805–823 via block 813 for each bit of the DC_DAC variable until Next_Bit is decremented to zero as determined at block 819. When this occurs, the DC_DAC variable, when programmed into the DC DAC 337 at the lowest gain step of the AGC DAC 297 provides the $R_D$ signal as close as possible to, and less than or equal to, the predetermined ADC_HI_RANGE constant. Operation then proceeds to block 825 where the ADC_HiLo variable is queried. Since ADC HiLo is still 1 in the first iteration, operation proceeds to next block 827 in which an indexed variable DC_DAC HI$_i$ is set equal to the DC_DAC variable for storage and/or calculation. Also at block 827, a mean value variable ADC_HI$_i$ is set equal to the current value of ADC_Mean. It is noted that although ADC_Mean should be equal to the ADC_HI_RANGE constant, it may vary somewhat and any variation is stored for use in calculations.

Operation proceeds to block 829 from block 827 to reset variables for the second half of the first iteration of the successive approximation for the current gain step (i). In particular, Next_Bit is set back equal to MSB_BIT, ADC_HiLo is set equal to 0 and the DC_DAC variable is set equal to a binary variable ALL_ONE meaning that all bits of DC_DAC are set equal to one. This initializes the variables for the second half of the calculation for the current gain step in which the DC DAC 337 is started at the maximum value or +2047 and successively decreased according to the successive approximation algorithm until a predetermined ADC_LO_RANGE constant is achieved as determined at block 815. It is noted that DC_DAC is effectively set equal to −1 since 111111111111b in sign 2's complement form represents −1 which is approximately half way between the maximum DAC value of +2047 and the minimum DAC value of −2048.

From block 829, operation proceeds back to block 805 where the new DC_DAC value is written into the DC DAC 337. Again, one or more samples of the $R_D$ signal are taken at block 807 and the mean value of valid samples are determined and stored into the ADC_Mean variable at block 809. At next block 811, since ADC_HiLo is equal to 0, operation proceeds to block 815 in which it is determined whether ADC_Mean is less than the ADC_LO_RANGE constant. If not, operation proceeds directly to 819 and if so, operation proceeds to next block 817 where the Next_Bit is discarded in a similar manner as previously described. If the Next_Bit is not discarded during the first iteration, then operation proceeds with a DC_DAC value of −1 or 111111111111b. If the Next_Bit is discarded at block 817, then the DC_DAC value is set equal to +2047 or 011111111111b, which is the maximum DAC value.

At next block 819, it is queried whether Next_Bit is equal to 0 and if not, operation proceeds to blocks 821 and 823 where, as before, Next_Bit is decremented and the corresponding bit of the DC_DAC variable is flipped for evaluation. In a similar manner as before, if DC_DAC is equal to −1 or 111111111111b, then at block 823 DC_DAC is next set equal to −1025 or 101111111111b. Alternatively, if DC_DAC was +2047 or 011111111111b, then at block 823 DC_DAC is set equal to +1023 or 001111111111b.

Operation loops in a similar manner for the low to high successive approximation between blocks 805–823 via block 815 until Next_Bit is decremented to zero as determined at block 819. At this point, the ADC_Mean should be close to, and greater than or equal to, the ADC_LO_RANGE constant as determined at block 815. After all bits have been examined, operation proceeds to next block 825 in which the value of ADC_HiLo is queried. Since this is the second half of the first iteration at the current gain step, where ADC_HiLo is 0, operation proceeds to next block 831 where the DC_DAC variable is stored into an index variable DC_DAC_LO$_i$ for the current gain step. Also, the current value of ADC_Mean is stored into an index value ADC_LO$_i$ at block 831. At next block 833, the variables are initialized for the first half of the next iteration of the successive approximation procedure, as tracked by the Gain-Step variable. In particular, Next_Bit is set equal to 12, ADC_HiLo is set back equal to 1, and DC_DAC is set back equal to ALL_ZERO. Furthermore, GainStep and the index "i" are both incremented. As described previously, GainStep is initially set to GS_MIN or −64 in the embodiment shown. Thus, at the first occurrence of block 833, GainStep is set equal to −63 and "i" is incremented to 2. At next block 835, it is queried whether GainStep has become greater than the GS_MAX constant to determine if calculations have been completed for all gain steps. In the first iteration of block 835, operation proceeds back to block 803 where the new GainStep value is written into AGC DAC 297. The entire first and second halves of the successive approximation utilizing the DC_DAC variable is repeated for the next GainStep. In this manner, for each GainStep, the indexed variables DC_DAC_HI$_i$, ADC_HI$_i$, DC_DAC_LO$_i$ and ADC_LO$_i$ are determined and locally stored if necessary.

After all calculations for each GainStep have been determined in which GainStep is incremented at block 833 to be greater than GS_MAX as determined at block 835, then operation proceeds to block 837 as shown in FIG. 8C in which calculations are initiated using the stored indexed variables. At block 837, the gain data, referred to as G(i), is determined for each gain step (i). In the embodiment shown, "i" is the index value varying from 1 to 128 representing GainStep values of −64 to +63, respectively. The following equation (4) is used at block 837 to calculate the gain data G(i):

$$G(i) = \frac{(ADC\_lsb)}{(DC\_DAC\_lsb)} * \frac{(ADC\_HI_i - ADC\_LO_i)}{(DC\_DAC\_HI_i - DC\_DAC\_LO_i)} \quad (4)$$

where ADC_lsb is the step value conversion of the ADC 313, DC_DAC_lsb is the step value conversion of the DC DAC 337 and where ADC_HI$_i$, ADC_LO$_i$, DC_DAC_HI$_i$ and DC_DAC_LO$_i$ are the indexed variables previously determined at block 827 and 831. In the embodiment shown, ADC_lsb is approximately equal to 1 Vpp/64 or $15.625 \times 10^{-03}$ volts per step and DC_DAC_lsb is approximately equal to 150 mV/4096 or $36.62 \times 10^{-03}$ mV per step. 128 gain data values G(i) are determined in the embodiment shown. At next block 839, a filter is applied to smooth the gain data G(i). In one embodiment, a five-wide moving average filter is applied across the gain data G(i) to smooth out the curve. A three-wide filter is used at the end points for the second and second to last values and the end point values are not changed. In particular, the first three values are averaged and the second value is set equal to the average. Then, the first five values are averaged and the third value is set equal to the average. Then, the second through fifth values are averaged and the fourth value is set equal to the average. Operation of the five-wide moving average continues in this manner until the last five values are averaged and the third to the last value is set equal to the average. Then, the last three values are averaged and the second to last value is set equal to the average, and the filter operation is completed. A filter is utilized since the measured gain values may be calculated in a very noisy environment where substantial variations and inaccuracies would otherwise result.

Operation proceeds from block 839 to block 841 in which a calculated DC offset value Voffset(i) is determined for each gain step (i), where Voffset refers to the calculated DC offset at the input to the BB AGC amplifier 307. A simplified version of the DC offset value, denoted Voffset(i)$_S$, is determined according to the following equation (5):

$$Voffset(i)_s = -DC\_DAC\_lsb * \frac{DC\_DAC\_LO_i + DC\_DAC\_HI_i - 4096}{2} \quad (5)$$

The simplified version assumes that the ADC_HI$_i$ and ADC_LO$_i$ variables are set to the ADC_HI_RANGE and ADC_LO_RANGE constants, respectively. In operation, however, the ADC_HI$_i$ and ADC_LO$_i$ variables may vary by a step or two, so that an adjust value ADJ$_i$ is calculated for each gain step (i) according to the following equation (6):

$$ADJ_i = \frac{(ADC\_HI_i + ADC\_LO_i) * (DC\_DAC\_HI_i - DC\_DAC\_LO_i)}{2 * (ADC\_HI_i - ADC\_LO_i)} \quad (6)$$

The adjust value is utilized to calculate more accurate DC offset values Vo(i) according to the following equation (7):

$$Voffset(i) = \qquad (7)$$
$$DC\_DAC\_lsb * \left[ ADJ_i - \frac{DC\_DAC\_LO_i + DC\_DAC\_HI_i - 4096}{2} \right]$$

It is noted that for each case in which ADC_HI$_i$ is equal to ADC_HI_RANGE and where ADC_LO$_i$ is equal to ADC_LO_RANGE, that the adjust value ADJ$_i$ cancels and becomes zero. Otherwise, the adjust value is utilized to improve accuracy. Operation proceeds to block 843 to smooth out the DC offset data Voffset(i) in a similar manner as described above for block 839, such as the five-wide moving average filter with the three-wide filter at both ends.

At next block 845, DC offset derivative data dV/dG$_{dB}$(i) is determined for each gain step (i) by first calculating the DC offset value at the output of the BB AGC amplifier 307 according to the equation Vo(i)=Voffset(i)*G(i), and then plugging each Vo(i) value into equation (3) previously described. At next block 847, the DC offset derivative data dV/dG$_{dB}$(i) is smoothed in a similar manner as previously described, such as with the five-wide moving average filter with a three-wide filter used at either end points. At next block 849, the measured and/or calculated data is converted and/or otherwise stored depending upon the particular configuration. For example, for the compensation systems 500–700, the gain data G(i) is stored in the LUT 501, for the compensation system 700, the DC offset data Vo(i) is stored in the LUT 701, and for the compensation system 600, the derivative data dV/dG$_{dB}$(i) is used to determine the maximum gain change limit GM or one or more gain change limits for one or more gain steps. The determined gain change limit value(s) are stored in the limit block 601.

It is appreciated that removal of the IF portion of a high performance wireless transceiver, with proper DC compensation and DC calibration, results in a relatively high performance, low cost wireless ZIF transceiver with reduced power requirements. The use of a calibrated DC compensation loop interfaced to the gain loop according to embodiments of the present invention achieves these goals. Estimation of DC at the output of the baseband gain amplifier and amplification of the DC estimate based on a gain conversion linked with the gain loop provides a DC offset at the input to effectively control DC provided to the baseband processor decoder devices. The calibration procedure provides additional accuracy by periodically measuring actual gain and DC offset and storing one or more gain adjust values or DC offset adjust values. The adjust values are utilized during operation to modify the gain conversion signal or to limit gain change to maintain loop control. Such capability enables a WLAN system to be designed for use at home or in the small business that is relatively robust and that has significant performance with relatively high data throughput operation. A ZIF design in accordance with embodiments of the present invention provides high sensitivity and allows for fast settling of the gain and DC offset loops. Fast settling is desirable because of the bursty and packetized nature of communications. The design also contends well with large amounts of inherent noise which is averaged out or otherwise eliminated in order to compensate for DC offsets.

Although a system and method according to the present invention has been described in connection with one or more preferred embodiments, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A calibrated DC compensation system for a wireless communication device configured in a zero intermediate frequency (ZIF) architecture, comprising:

a combiner that combines a DC offset signal with an input signal and that provides an adjusted input signal;

a gain amplifier that receives the adjusted input signal and that provides an amplified input signal based on a gain adjust signal;

a gain feedback circuit that receives the amplified input signal, that estimates input signal power and that provides the gain adjust signal in an attempt to maintain the input signal power at a target power level;

a DC estimator that estimates a DC level in the amplified input signal and that provides a DC estimate signal;

a DC amplifier that receives the DC estimate signal and that provides the DC offset signal based on a gain conversion signal;

a programmable gain converter, coupled to the DC amplifier and the gain feedback circuit, that provides the gain conversion signal based on the gain adjust signal; and a calibrator, coupled to the gain converter and the gain feedback circuit, that periodically performs a calibration procedure and that programs the gain converter.

2. The calibrated DC compensation system of claim 1, further comprising:

the gain adjust signal having a plurality of gain steps;

the gain converter including an adjust memory, the adjust memory including a plurality of adjust values, each adjust value corresponding to at least one of the plurality of gain steps of the gain adjust signal;

the gain converter providing the gain conversion signal to the DC amplifier based on the gain adjust signal and a corresponding one of the plurality of adjust values; and the calibrator determining a plurality of DC differential values, each DC differential value corresponding to at least one of the plurality of gain steps of the gain adjust signal, the calibrator programming the adjust memory based on the plurality of DC differential values.

3. The calibrated DC compensation system of claim 2, wherein the plurality of adjust values incorporate conversion of gain ranges and gain scales between the gain amplifier and the DC amplifier.

4. The calibrated DC compensation system of claim 2, wherein each of the plurality of adjust values comprises either one of a multiplier and an additive value.

5. The calibrated DC compensation system of claim 1, further comprising:

the gain adjust signal having a plurality of gain steps;

the gain converter comprising a lookup table that stores a plurality of gain conversion values, each gain conversion value corresponding to one of the plurality of gain steps of the gain adjust signal, wherein the lookup table provides a corresponding gain conversion value for each gain step of the gain adjust signal; and the calibrator determining a plurality of gain values of the gain amplifier, each gain value corresponding to one of the plurality of gain steps of the gain adjust signal, the calibrator programming the lookup table with the plurality of gain conversion values.

6. The calibrated DC compensation system of claim 5, wherein the calibrator incorporates differences in gain ranges and gain scales of the gain amplifier and the DC amplifier when determining the plurality of gain conversion values.

7. The calibrated DC compensation system of claim 5, further comprising:

the calibrator controlling the gain feedback circuit to apply the gain adjust signal to each of the plurality of gain steps;

for each of the plurality of gain steps, the calibrator adjusting a DC offset and sampling the amplified input signal until the amplified input signal achieves first and second predetermined range values with corresponding first and second DC offset values; and the calibrator determining the plurality of gain conversion values using the first and second predetermined range values and the first and second DC offset values for each of the plurality of gain steps.

8. The calibrated DC compensation system of claim 7, further comprising:

the first and second predetermined range values corresponding to a predetermined range of the amplified input signal; and the calibrator using a successive approximation procedure to determine the first and second DC offset values.

9. The calibrated DC compensation system of claim 7, further comprising:

a second lookup table that stores a plurality of DC adjust values, each corresponding to one of the plurality of gain steps of the gain adjust signal, wherein the second lookup table provides a corresponding DC adjust value for each gain step of the gain adjust signal;

the calibrator determining the plurality of DC adjust values using the first and second DC offset values for each of the plurality of gain steps;

the DC amplifier providing a gain compensated DC signal; and a second combiner, coupled to the second lookup table and the DC amplifier, that combines the gain compensated DC signal with a DC adjust value from the second lookup table to provide the DC offset signal.

10. The calibrated DC compensation system of claim 5, wherein the gain feedback circuit further comprises a gain adjust limiter that limits change of the gain adjust signal during operation.

11. The calibrated DC compensation system of claim 10, further comprising:

the gain adjust limiter limiting change of the gain adjust signal to a maximum gain change limit; and the calibrator using an upper bound method to determine the maximum gain change limit based on the determined plurality of gain values and a predetermined linear DC offset change model of the gain amplifier.

12. The calibrated DC compensation system of claim 10, further comprising:
the gain adjust limiter limiting change of the gain adjust signal based on at least one gain change limit;
the calibrator further determining a plurality of DC offset values, each DC offset value corresponding to one of the plurality of gain values; and
the calibrator determining the at least one gain change limit using the plurality of gain values and the plurality of DC offset values and programming the gain adjust limiter with the at least one gain change limit.

13. The calibrated DC compensation system of claim 12, wherein the at least one gain change limit comprises a plurality of gain change limits that corresponds to the plurality of gain values.

14. A wireless communication device with calibrated DC compensation, comprising:
a ZIF transceiver, comprising:
an RF mixer circuit that converts a radio frequency (RF) signal to a baseband input signal;
a combiner, coupled to the RF mixer, that combines a DC offset signal with the baseband input signal to provide an adjusted baseband input signal; and
a baseband amplifier, coupled to the combiner, that receives the adjusted baseband input signal and that asserts an amplified input signal based on a gain adjust signal; and
a baseband processor, coupled to the ZIF transceiver, the baseband processor comprising:
gain control logic that receives the amplified input signal, that estimates input signal power and that asserts the gain adjust signal in an attempt to keep the input signal power at a target power level;
DC control logic that estimates an amount of DC in the amplified input signal and that provides the DC offset signal in an attempt to reduce DC level of the amplified input signal;
a gain converter, coupled to the gain control logic and the DC control logic, that converts gain between the gain control logic and the DC control logic; and
calibration logic, coupled to the gain converter and the gain control logic, that periodically performs a calibration procedure and that programs the gain converter.

15. The wireless communication device of claim 14, further comprising:
the gain adjust signal having a plurality of gain steps;
the gain converter comprising a memory device that stores a plurality of gain conversion values, each gain conversion value corresponding to one of the plurality of gain steps of the gain adjust signal, wherein the memory device provides a corresponding gain conversion value for each gain step of the gain adjust signal; and
the calibration logic setting the gain adjust signal to each of the plurality of gain steps, determining a corresponding plurality of gain values of the baseband amplifier and programming the memory device with the plurality of gain conversion values.

16. The wireless communication device of claim 15, wherein the gain control logic further comprises a gain adjust limiter that limits change of the gain adjust signal during operation.

17. The wireless communication device of claim 16, further comprising:

the gain adjust limiter limiting change of the gain adjust signal to a maximum gain change limit; and
the calibration logic using an upper bound method to determine the maximum gain change limit based on the plurality of gain values and a predetermined linear DC offset change model of the baseband amplifier.

18. The wireless communication device of claim 16, further comprising:
the gain adjust limiter limiting change of the gain adjust signal based on a plurality of gain change limits;
the calibration logic further determining a plurality of DC offset values, each DC offset value corresponding to one of the plurality of gain steps; and
the calibration logic determining the at least one gain change limit using the plurality of gain values and the plurality of DC offset values and programming the gain adjust limiter with the plurality of gain change limits.

19. The wireless communication device of claim 15, further comprising:
the calibration logic controlling the gain control logic to apply the gain adjust signal to each of the plurality of gain steps;
for each of the plurality of gain steps, the calibration logic controlling the DC control logic to adjust the DC offset signal and sampling the amplified input signal until the amplified input signal achieves first and second predetermined range values with corresponding first and second DC offset values; and
the calibration logic determining the plurality of gain conversion values using the first and second predetermined range values and the first and second DC offset values for each of the plurality of gain steps.

20. The calibrated DC compensation system of claim 19, further comprising:
a second memory device, coupled to the calibration logic and the DC control logic, that stores a plurality of DC adjust values, each corresponding to one of the plurality of gain steps of the gain adjust signal, wherein the second lookup table provides a corresponding DC adjust value for each gain step of the gain adjust signal;
the calibration logic determining the plurality of DC adjust values using the first and second DC offset values for each of the plurality of gain steps; and
the DC control logic adjusting the DC offset signal with received DC adjust values from the second memory device.

21. A method of reducing DC in a wireless zero intermediate frequency (ZIF) device, comprising:
converting a received radio frequency (RF) signal to a baseband signal;
combining a DC offset with the baseband signal to achieve an adjusted baseband signal;
amplifying the adjusted baseband signal based on a gain signal to provide an amplified input signal;
determining a power level of an input baseband signal from the amplified input signal;
controlling the gain signal to achieve a target power level of the input baseband signal;
determining a DC level of the amplified input signal;
providing a gain conversion signal based on the gain signal;
controlling the DC offset based on the gain conversion signal and the determined DC level of the amplified input signal in an attempt to reduce the DC level of the amplified input signal; and periodically performing a calibration procedure to adjust the gain conversion signal.

22. The method of claim 21, further comprising:

the performing a calibration procedure comprising:

measuring a gain value for each of a plurality of gain levels of the gain signal; and storing a plurality of gain conversion values, each corresponding to one of the plurality of gain levels; and the providing a gain conversion signal comprising providing one of the plurality of gain conversion values for each of the plurality of gain levels of the gain signal.

23. The method of claim 22, wherein the performing a calibration procedure further comprises converting between gain ranges and gain scales.

24. The method of claim 22, further comprising:

the performing a calibration procedure further comprising determining a maximum gain change limit; and the controlling the gain signal comprising limiting change of the gain signal based on a gain level of the gain signal and the maximum gain change limit.

25. The method of claim 22, further comprising:

the performing a calibration procedure further comprising:

measuring a plurality of DC offset values, each corresponding to one of a plurality of gain levels of the gain signal;

determining a plurality of gain change limit values based on the plurality of gain values and the plurality of DC offset values; and storing the plurality of gain change limit values, each corresponding to one of the plurality of gain levels; and the controlling the gain signal comprising limiting change of the gain signal based on a gain level of the gain signal and a corresponding one of the plurality of gain change limit values.

26. The method of claim 22, further comprising:

the performing a calibration procedure further comprising:

measuring at least one DC offset value for each of a plurality of gain levels of the gain signal; and storing a plurality of DC adjust values; and the controlling the DC offset including adding one of the plurality of DC adjust values based on a gain level of the gain signal.

27. The method of claim 21, wherein the performing a calibration procedure further comprises:

setting the gain signal to each of a plurality of gain levels;

for each gain level, determining a first DC offset value to achieve a first predetermined range limit of the amplified input signal; and for each gain level, determining a second DC offset value to achieve a second predetermined range limit of the amplified input signal.

28. The method of claim 27, wherein the determining the first and second DC offset values is based on successive approximation.

29. The method of claim 27, further comprising:

determining and storing a plurality of gain values for each gain level of the gain signal using the first and second DC offset values.

30. The method of claim 27, further comprising:

determining and storing a plurality of DC offset values for each gain level of the gain signal using the first and second DC offset values.

* * * * *